(12) United States Patent
Wang et al.

(10) Patent No.: US 12,125,876 B2
(45) Date of Patent: Oct. 22, 2024

(54) SEMICONDUCTOR DEVICE AND METHOD

(71) Applicant: Taiwan Semiconductor Manufacturing Company, Ltd., Hsin-Chu (TW)

(72) Inventors: Kuan-Cheng Wang, Toufen Township (TW); Han-Ti Hsiaw, Zhubei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 467 days.

(21) Appl. No.: 15/355,783

(22) Filed: Nov. 18, 2016

(65) Prior Publication Data

US 2018/0145131 A1 May 24, 2018

(51) Int. Cl.
*H01L 29/06* (2006.01)
*H01L 21/02* (2006.01)
*H01L 21/311* (2006.01)
*H01L 21/3115* (2006.01)
*H01L 21/8234* (2006.01)
*H01L 27/088* (2006.01)
*H01L 29/66* (2006.01)
*H01L 29/78* (2006.01)
*H01L 21/8238* (2006.01)

(52) U.S. Cl.
CPC ...... *H01L 29/0649* (2013.01); *H01L 21/0217* (2013.01); *H01L 21/02321* (2013.01); *H01L 21/31116* (2013.01); *H01L 21/31155* (2013.01); *H01L 21/823431* (2013.01); *H01L 21/823481* (2013.01); *H01L 27/0886* (2013.01); *H01L 29/66545* (2013.01); *H01L 29/66795* (2013.01); *H01L 29/7851* (2013.01); *H01L 21/823878* (2013.01)

(58) Field of Classification Search
CPC ........... H01L 21/0217; H01L 21/31116; H01L 21/31155; H01L 21/82; H01L 27/0886; H01L 29/66; H01L 29/78; H01L 29/0649; H01L 21/02321; H01L 21/823431; H01L 21/823481
USPC ......................... 257/401–405, 416, 420–425
See application file for complete search history.

(56) References Cited

U.S. PATENT DOCUMENTS

| | | | | |
|---|---|---|---|---|
| 5,330,611 | A | * | 7/1994 | Doll ........................ C23C 16/36 257/E21.124 |
| 5,872,045 | A | * | 2/1999 | Lou ........................ H01L 21/763 438/432 |
| 9,087,860 | B1 | * | 7/2015 | Banghart .......... H01L 29/66803 |
| 9,093,477 | B1 | * | 7/2015 | Lin .................... H01L 21/26586 |
| 2009/0189507 | A1 | * | 7/2009 | Winkler ............. C09K 11/7721 313/484 |
| 2012/0190167 | A1 | * | 7/2012 | Huang .............. H01L 21/76229 438/400 |
| 2015/0145096 | A1 | * | 5/2015 | Hsu ..................... H01L 27/1464 257/460 |

(Continued)

*Primary Examiner* — Ori Nadav
(74) *Attorney, Agent, or Firm* — Slater Matsil, LLP

(57) ABSTRACT

FinFET structures and methods of forming the same are disclosed. In a method, a fin is formed on a substrate, an isolation region is formed on opposing sides of the fin. The isolation region is doped with carbon to form a doped region, and a portion of the isolation region is removed to expose a top portion of the fin, wherein the removed portion of the isolation region includes at least a portion of the doped region.

16 Claims, 26 Drawing Sheets

(56) References Cited

U.S. PATENT DOCUMENTS

| | | | |
|---|---|---|---|
| 2016/0163559 A1* | 6/2016 | Ryan | H01L 21/76826 257/288 |
| 2016/0163855 A1* | 6/2016 | Hower | H01L 21/266 257/336 |
| 2016/0343799 A1* | 11/2016 | Yi | H01L 21/76801 |

* cited by examiner

SEMICONDUCTOR DEVICE AND METHOD

BACKGROUND

Semiconductor devices are used in a large number of electronic devices, such as computers, cell phones, and others. Semiconductor devices include integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, Fin Field-Effect Transistors (FinFETs) or multiple gate transistors are being researched and implemented. However, with this new device structure and the continuous shrinking of even FinFETs, new challenges are being discovered.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
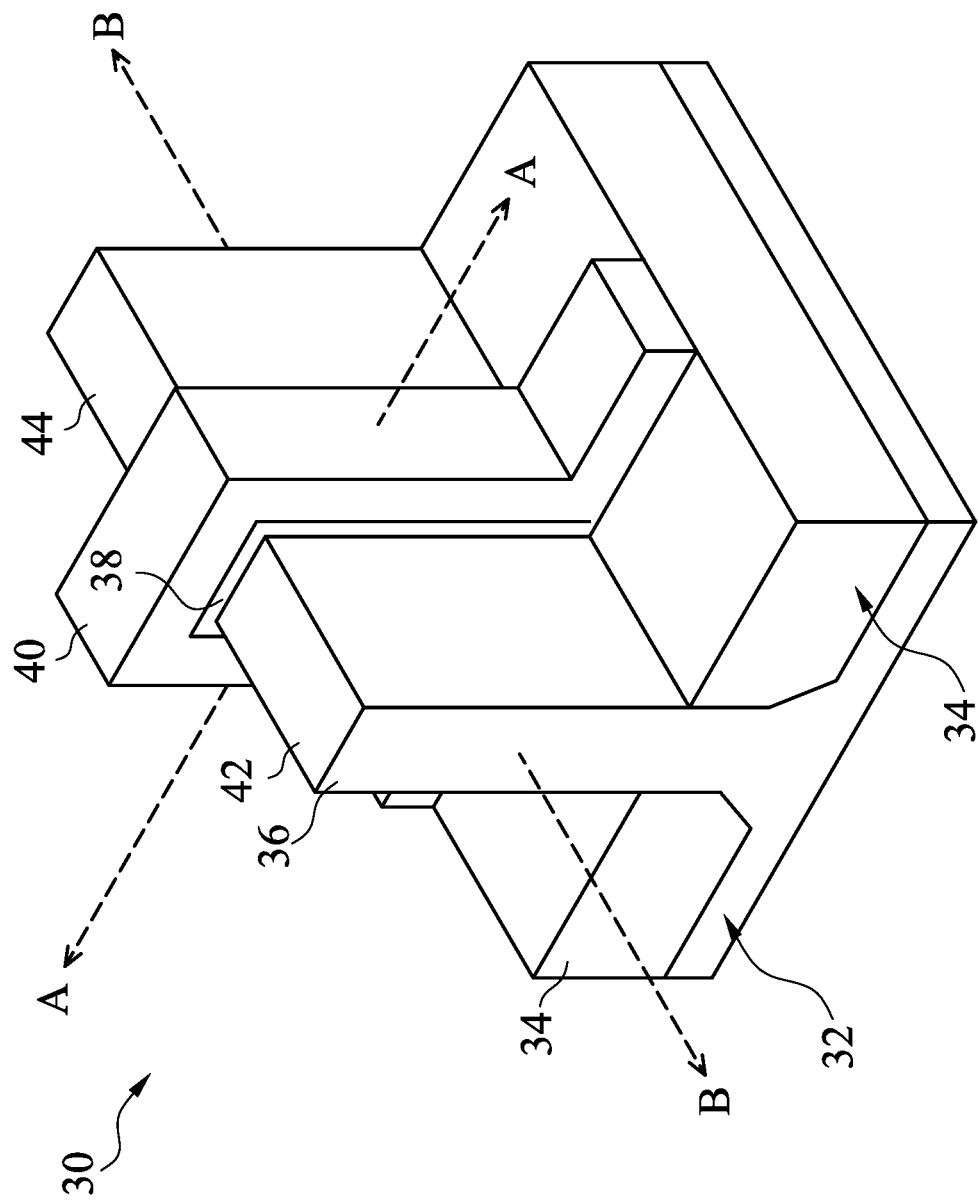
FIG. 1 is an example of a Fin Field-Effect Transistor (FinFET) in a three-dimensional view.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. In particular, methods are described herein of etching insulation material during a fin recess etch process. Prior to the fin recess etch, the insulation material is doped. For example, in some embodiments an insulation material of $SiO_2$ may be doped with carbon or silicon. The additional doping reduces the rate at which the insulation material is etched during the fin recess etch. This reduced etch rate may enable better etch uniformity than the higher etch rate for undoped insulation material. In some cases fin height may be difficult to precisely control for a higher etch rate. For example, fin recess loading may be exacerbated by a higher etch rate, resulting in nonuniform heights of fins between regions with different fin pattern densities. Additionally, voids within the insulation material are more likely to form if the etch rate is higher. A lower etch rate due to the presence of dopants may improve fin height control and uniformity. A lower etch rate may also reduce the likelihood of voids forming in the insulation material. Additionally, control of the locations, concentrations, profiles, or distribution of the dopants within the insulation material may provide improved control over etch rates at different locations within the insulation material during the fin recess etch. In various embodiments the doping may be uniformly applied across an entire wafer or, by using a mask, applied selectively at specific locations on the wafer. For example, a mask can be used to prevent doping at the fins themselves, or to prevent doping at certain regions of insulation material. In some embodiments a doping buffer layer may be disposed over the fins prior to deposition of the insulation material. The doping buffer layer may substantially prevent the dopants from entering the fins and also protect the fins from possible damage during the doping process. One of ordinary skill in the art will readily understand other modifications that may be made are contemplated within the scope of other embodiments. Although method embodiments are discussed in a particular order, various other method embodiments may be performed in any logical order and may include fewer or more steps than described herein.

FIG. 1 illustrates an example of a FinFET 30 in a three-dimensional view. The FinFET 30 includes a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and the gate electrode 40. FIG. 1 further illustrates reference cross-sections that are used in some later figures. Cross-section A-A is across a channel, the gate dielectric 38, and the gate electrode 40 of the FinFET 30. Cross-section B-B is perpendicular to cross-section A-A and is along a longitudinal axis of the fin 36 and in a direction of, for example, a current flow between the source/drain regions 42 and 44. Subsequent figures refer to these reference cross-sections for clarity.

FIGS. 2 through 16B are cross-sectional views of intermediate stages in the manufacturing of FinFETs, in accordance with an exemplary embodiment. FIGS. 2 through 8 illustrate reference cross-section A-A illustrated in FIG. 1, except that these Figures illustrate multiple FinFETs. In FIGS. 9A through 16B, figures ending with an "A" designation are illustrated along cross-section A-A of FIG. 1; and figures ending with a "B" designation are illustrated along cross-section B-B of FIG. 1.

Figure 2:
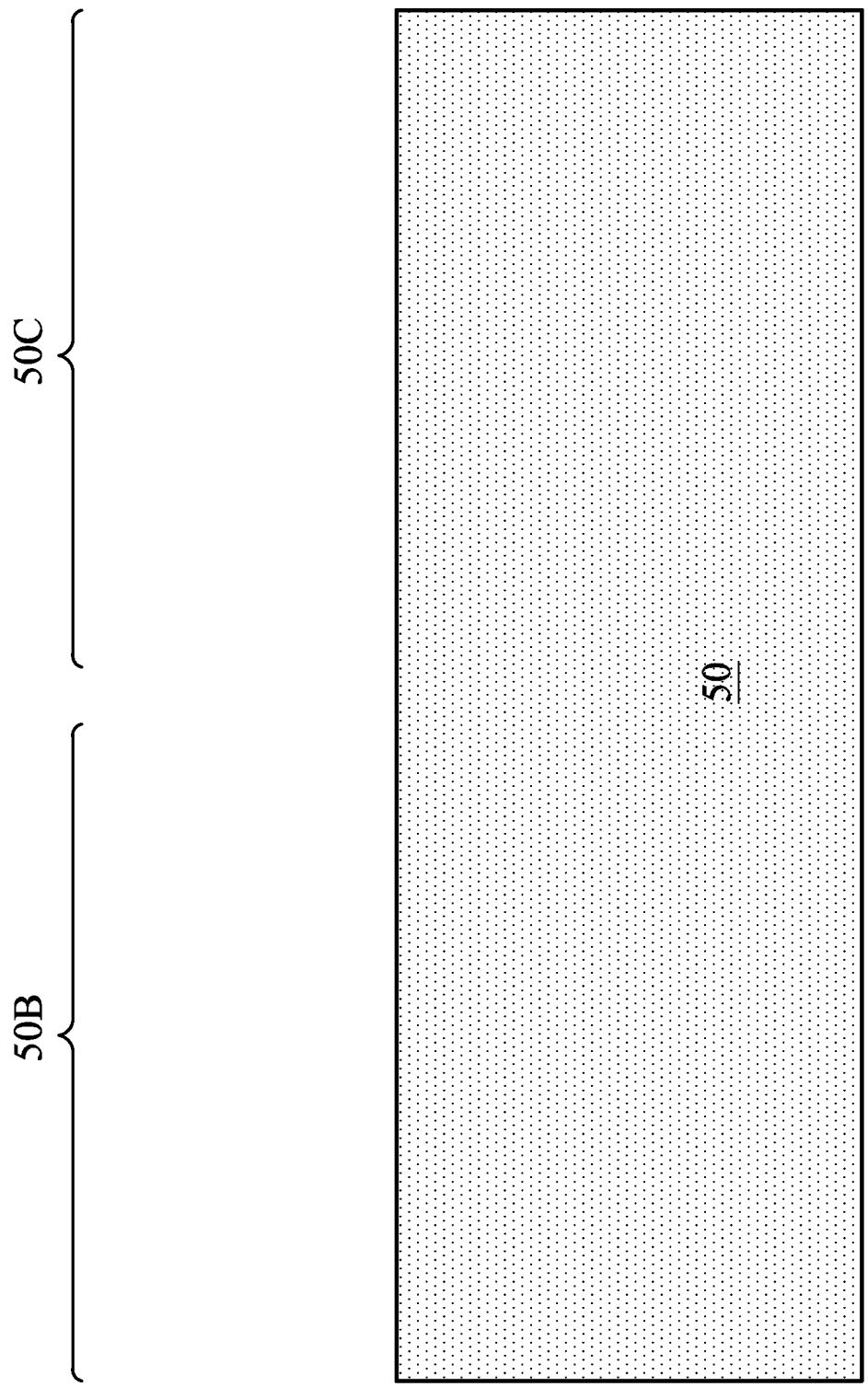
FIGS. 2 through 5, 6A-6C, 7-8, 9A-9B, 10A-10B, 11A-11B, 12A-12B, 13A-13B, 14A-14B, 15A-15B, and 16A-16B are cross-sectional views of intermediate stages in the manufacturing of FinFETs in accordance with some embodiments.

FIG. 2 illustrates a substrate 50. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50B and a second region 50C. The first region 50B can be for forming n-type devices, such as NMOS transistors, e.g., n-type FinFETs. The second region 50C can be for forming p-type devices, such as PMOS transistors, e.g., p-type FinFETs. In some embodiments, both the first region 50B and the second region 50C are used to form the same type of devices, such as both regions being for n-type devices or p-type devices.

Figure 3:
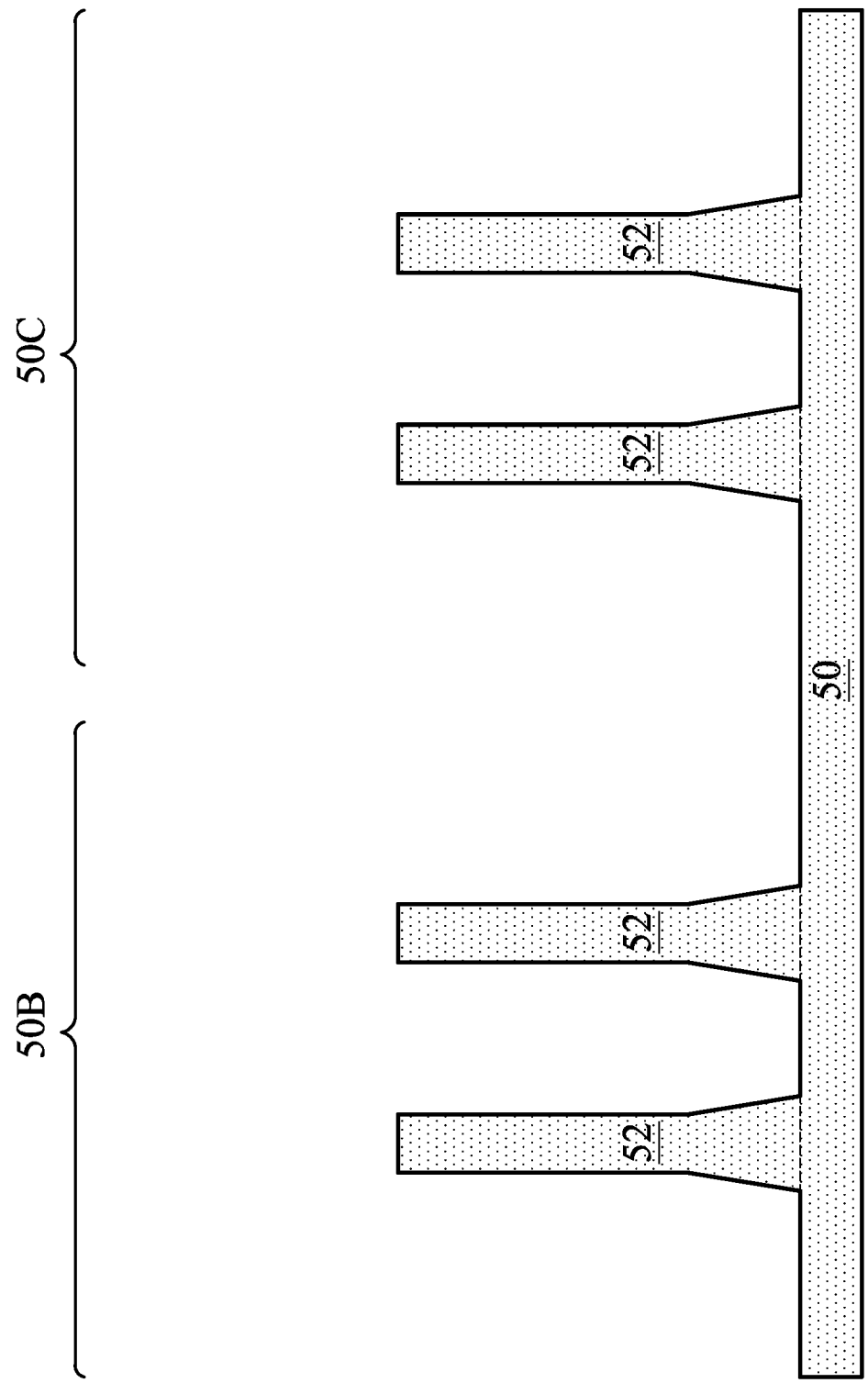

FIG. 3 illustrates the formation of fins 52. In FIG. 3, fins 52 are formed in the substrate 50. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

Figure 4:
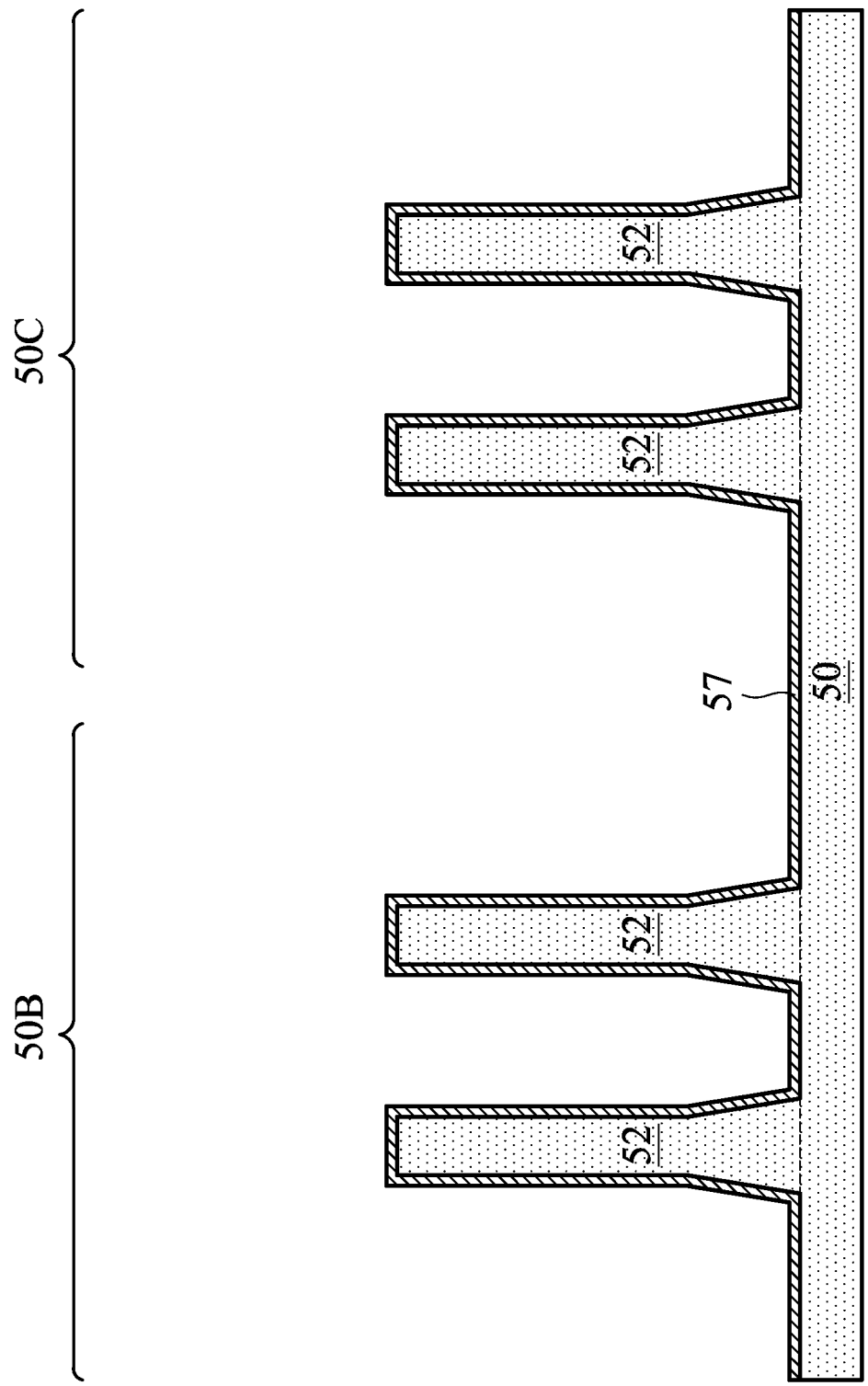

In FIG. 4, an optional doping buffer layer 57 is formed on the fins 52 and on the top surface of substrate 50. The optional doping buffer layer 57 may be, for example, silicon, silicon oxide, silicon nitride, a combination thereof, or the like. The doping buffer layer 57 may be deposited via atomic layer deposition (ALD), metal-organic chemical vapor deposition (MOCVD), low-pressure CVD (LPCVD), or another deposition technique, or be thermally grown according to acceptable techniques. In some embodiments, the doping buffer layer 57 may have a thickness between 10 Å and 100 Å, or another thickness. In some embodiments, the doping buffer layer 57 may reduce or eliminate the amount of insulation material dopants (described below) from entering the fins 52. The doping buffer layer 57 may also protect the fins 52 during the insulation material doping process.

Figure 5:
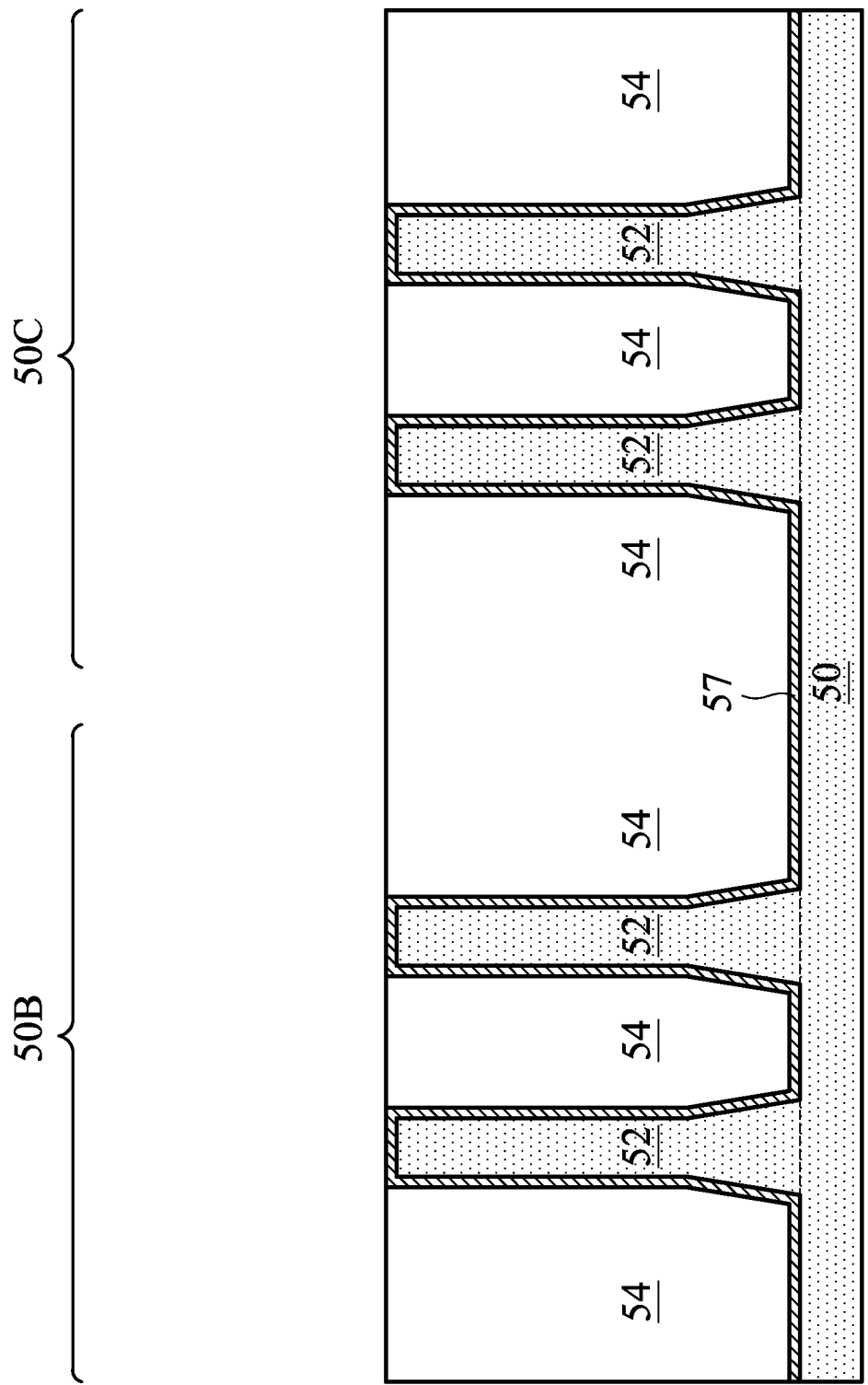

In FIG. 5, an insulation material 54 is formed between neighboring fins 52 to form the isolation regions 54. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post-curing to convert it to another material, such as an oxide), a spin-on process, a conformal oxide process, the like, or a combination thereof. In other embodiments, other insulation materials formed by any acceptable process may be used. In the illustrated embodiment, the insulation material 54 is silicon oxide ($SiO_2$) formed by a FCVD process. In some embodiments, an anneal process may be performed once the insulation material 54 is formed. In some embodiments, an anneal process is not performed until after doping the insulation material 54, described in greater detail below. In some embodiments, an anneal process may include multiple anneals, and some of these anneals may be performed prior to doping and some of these anneals may be performed after doping. In some embodiments, a flowable oxide or a spin-on oxide process may be used when the height/width aspect ratio of the isolation regions 54 between the fins 52 is greater than about 8.7, though other embodiments may have aspect ratios less than or equal to about 8.7. In some embodiments, a flowable oxide or a spin-on oxide process may be used when the critical dimension of the isolation region 54 measured between the tops of neighboring fins 52 is less than about 26 nm, though in other embodiments this critical dimension may be equal to or greater than about 26 nm. The insulating material 54 may be referred to as isolation regions 54. Further in FIG. 5, a planarization process, such as a chemical mechanical polish (CMP), may remove any excess insulation material 54 and form top surfaces of the isolation regions 54 and top surfaces of the fins 52 that are level. In some embodiments, the planarization process does not planarize to the top surfaces of the fins 52 but leaves excess insulation material 54 covering the top surfaces of the fins 52. In some embodiments, the planarization process is not performed until after the insulation material 54 has been doped (described below).

Figure 6A:
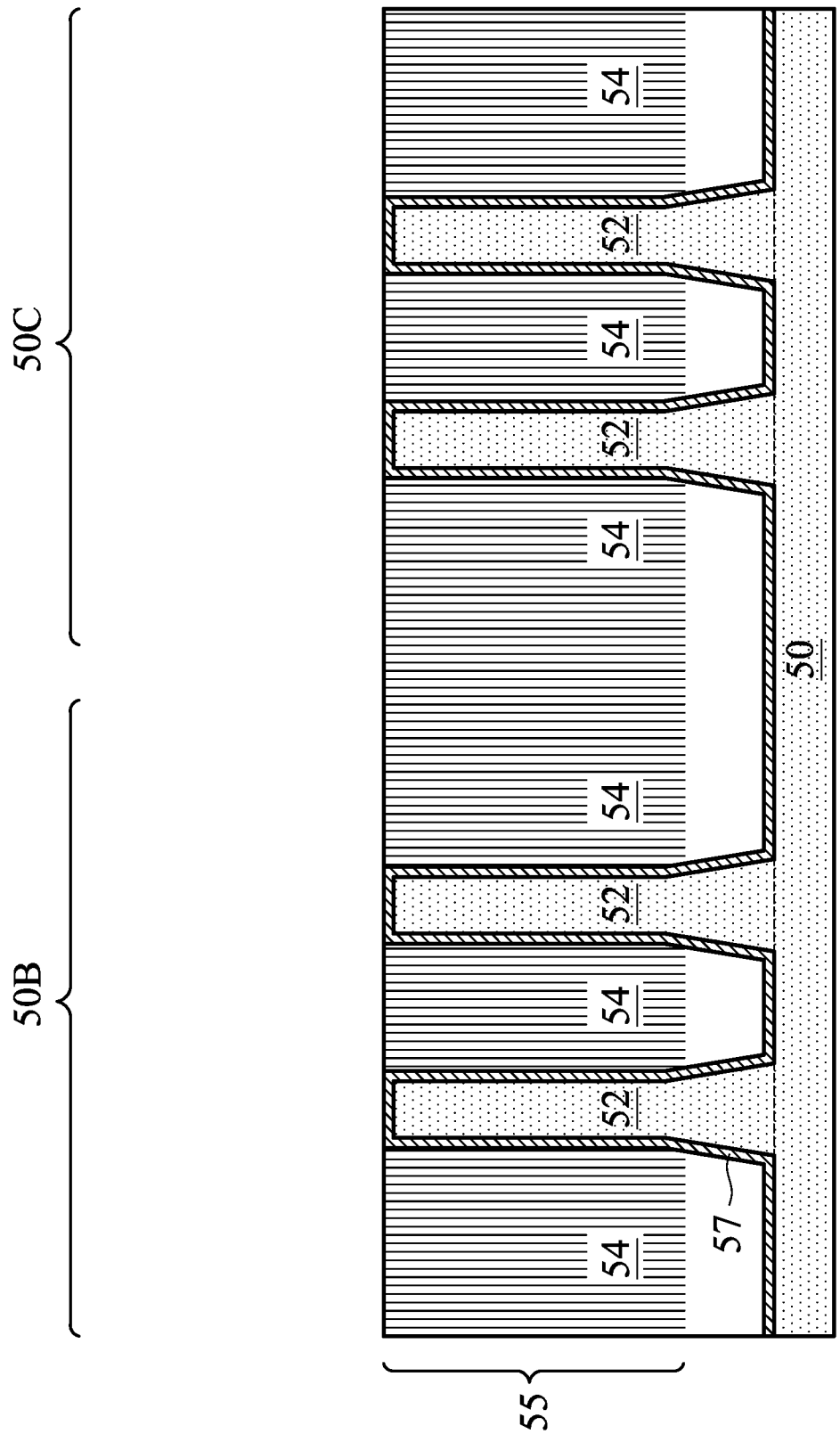

In FIG. 6a, the insulation material 54 is doped, forming a doped region 55. The insulation material doping process may be implemented by implantation (shown in FIG. 6b), thermal drive-in (shown in FIG. 6c), or another process. In some embodiments, the dopant is present in the insulation material 54 when the insulation material 54 is formed between neighboring fins 52. For example, in the case where the insulation material 54 is formed from a flowable oxide, the dopant may be incorporated into the flowable oxide prior to depositing the flowable oxide. In some embodiments, the dopant is carbon, and in other embodiments the dopant silicon or another dopant type. In some embodiments, more than one dopant type may be used. In some embodiments the doped region 55 is the entire volume of the insulation material 54, and in other embodiments the doped region 55 is only a portion of the insulation material 54. For example, undoped (or relatively undoped) portions of the insulation material 54 may be present above and/or below the doped region 55. In some embodiments the doped region 55 may extend toward the substrate 50 from the top surface of the insulation material 54, and the highest concentration of dopant may be near the top surface. In some embodiments the highest concentration of dopant may be separated from the top or bottom surface of the insulation material 54. In some embodiments, the doped region may have a substantially uniform concentration of dopant. In some embodiments, part of the doped region 55 may have a doping concentration of greater than about 5%.

The insulation material doping process may change physical characteristics of the insulation material 54, such as refractive index, density, etch resistance, or other characteristics. For example, the doped region 55 may have a greater density than the undoped insulation material 54. As another example, in an embodiment in which the insulation material 54 is $SiO_2$ and the dopant is carbon, the insulation material doping process may change the refractive index n at a wavelength of 633 nm of the insulation material from about n=1.46 (of undoped $SiO_2$) to a refractive index of n<1.46, such as about n=1.41 to 1.42 (for carbon-doped $SiO_2$).

In some embodiments, the insulation material doping process is applied globally over an entire wafer or substrate. In some embodiments, the insulation material doping process is applied selectively. For example, a mask layer may be formed and patterned using acceptable photolithography and etching techniques to mask specific regions from the doping process. In some embodiments, a planarization process (e.g., CMP as described above) is performed after the insulation material doping process.

Figure 6B:
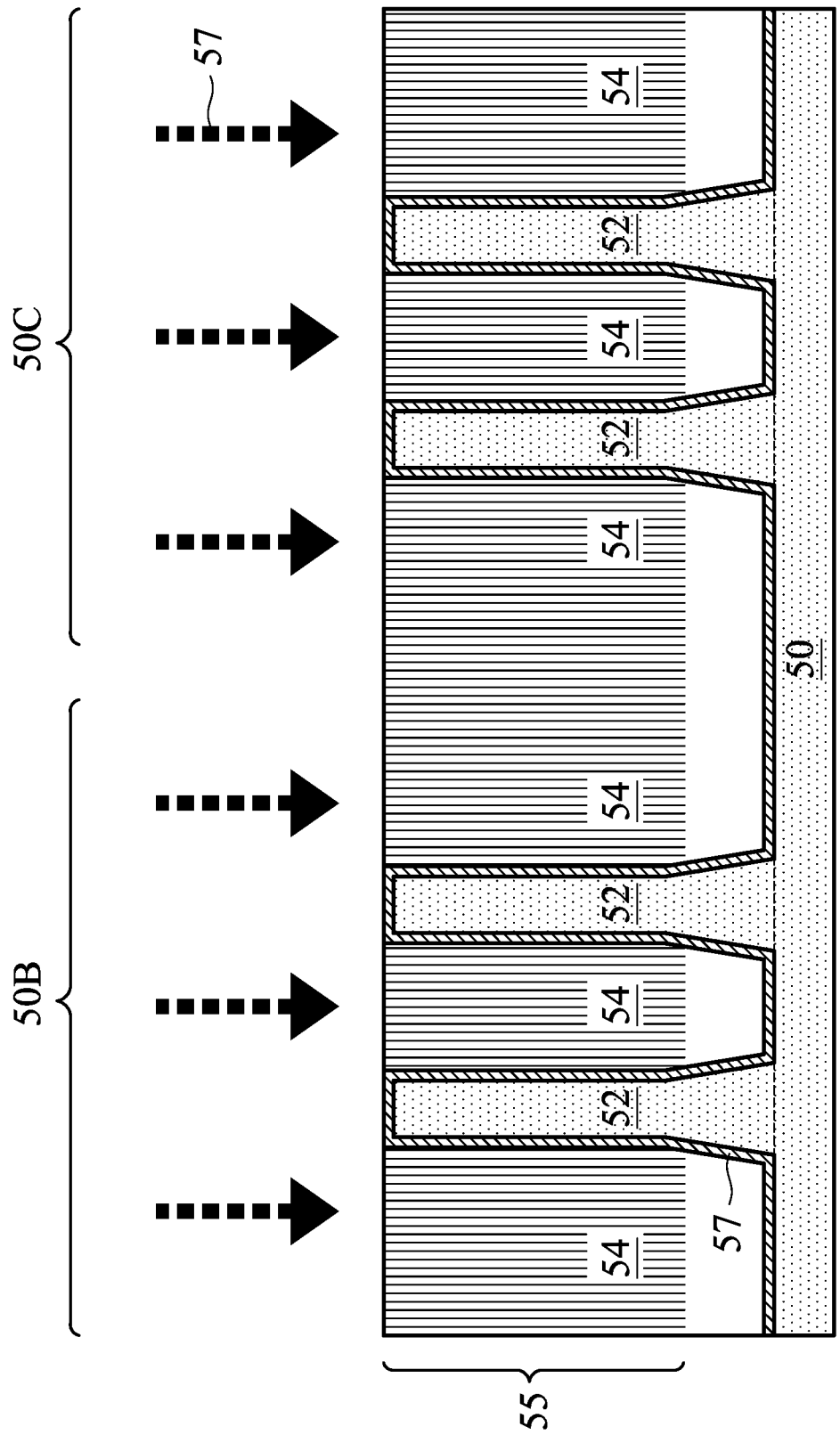
Figure 6C:
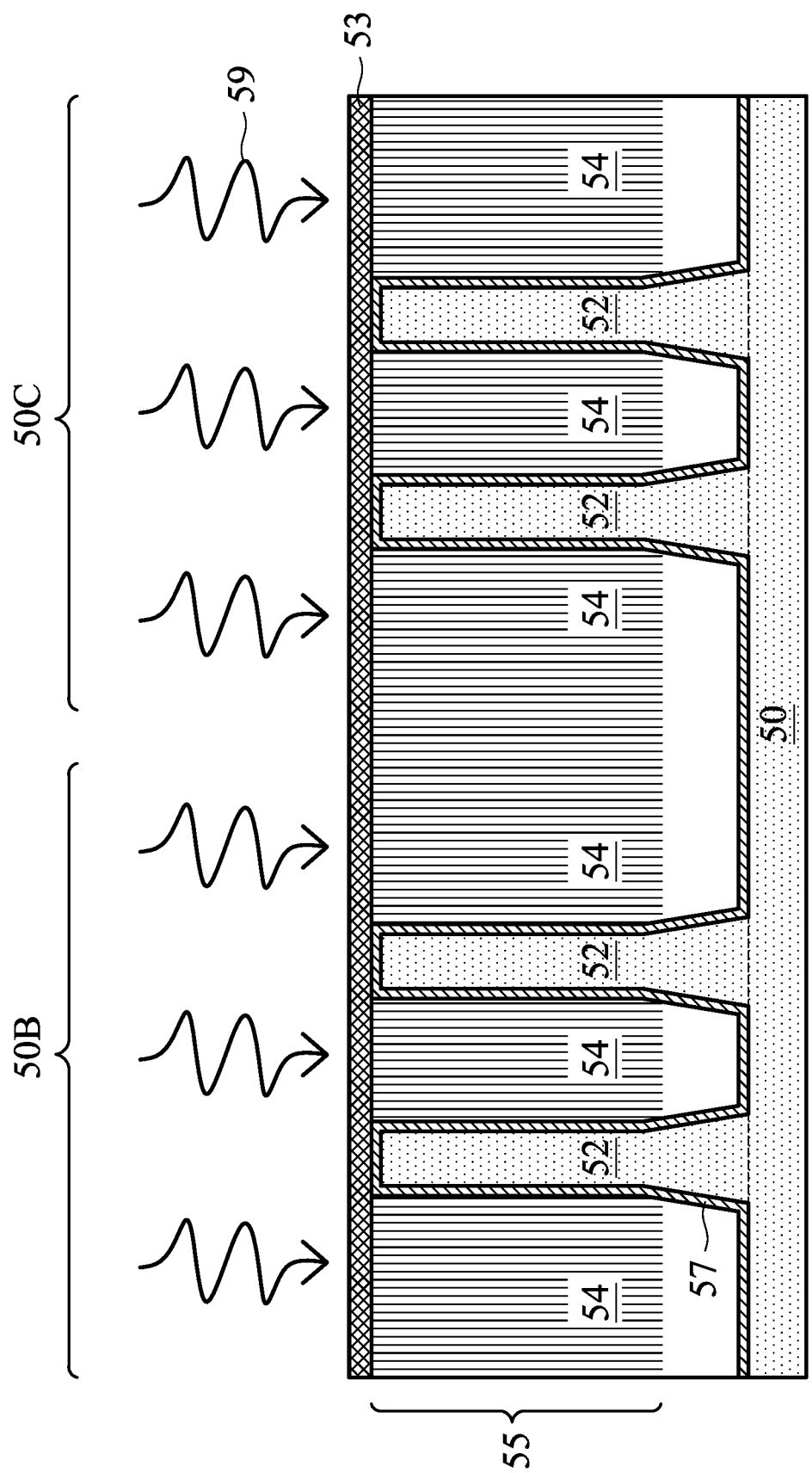

FIGS. 6b and 6c show embodiments of the insulation material doping process. FIG. 6b shows an insulation material doping process using implantation. For example, in one embodiment carbon ions may be implanted into the insulation material 54 to form doped region 55. By controlling the implant energy, the dopants may be implanted to any suitable depths within the insulation material 54. The implant dose may also be controlled to control the concentration of dopants within the doped region 55. A concentration of the dopant may have a gradient as a function of depth, such as increasing to a depth where the concentration is greatest and then decreasing towards further depths. In some embodiments, an upper doped region of the doped region 55 (proximate to a top surface of the doped region 55) has a concentration of the dopant greater than a concentration of the dopant of a lower doped region of the doped region 55 (proximate to the substrate 50). In some embodiments, after the implantation, a thermal process is performed to drive the dopant into the insulation material 54 to form the doped region 55. The thermal process may be any suitable thermal process, such as rapid thermal processing (RTP) anneal, spike anneal, laser anneal, or other thermal techniques. In some embodiments, an anneal process is not performed after the insulation material 54 is formed, and the thermal process performed after doping acts to anneal the insulation material 54 and drive in the dopant.

FIG. 6c shows another example insulation material doping process. A dopant-containing layer 53 may be formed on the insulation material 54. The dopant-containing layer 53 may be formed by deposition, spin-on, or any other suitable technique. For example, in an embodiment in which the dopant is carbon, the dopant-containing layer 53 may be a spin-on-carbon (SOC) layer, a deposited carbon layer, an epitaxially-grown silicon-carbon layer, or another carbon-containing compound. After the dopant-containing layer 53 is formed, a thermal process 59 is performed to drive the dopants from the dopant-containing layer 53 into the insulation material 54 to form the doped region 55. The thermal process 59 may be any suitable thermal process, such as rapid thermal processing (RTP) anneal, spike anneal, laser anneal, or other thermal techniques. In some embodiments, the thermal process 59 may be performed using a temperature between 400° C. and 1000° C., or another temperature. In some embodiments, an anneal process is not performed after the insulation material 54 is formed, and the thermal process 59 performed after doping acts to anneal the insulation material 54 and drive in the dopant. After the thermal process 59 is completed, the dopant-containing layer 53 may be removed, for example using an etch process, a CMP process or another process.

Figure 7:
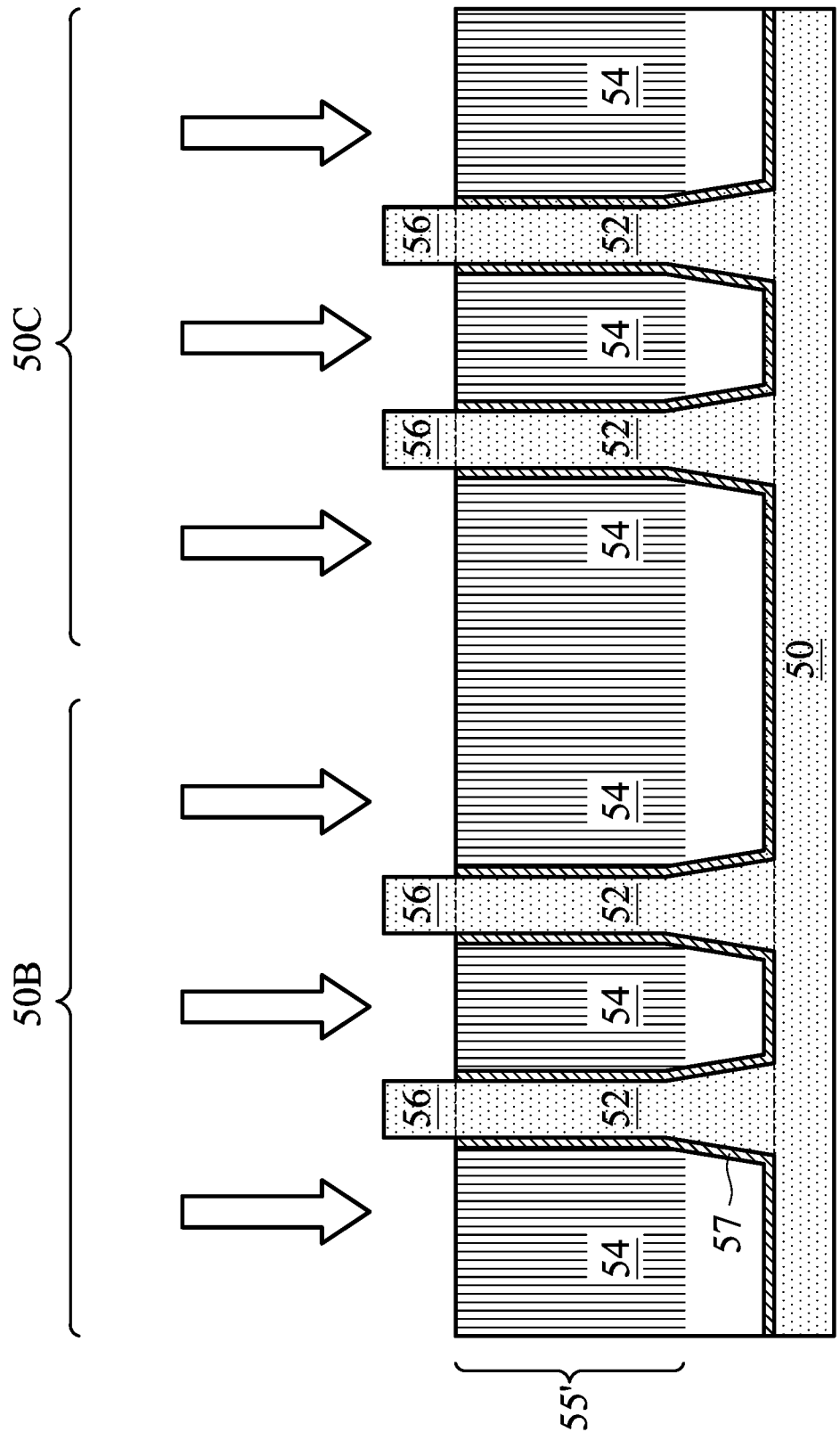

In FIG. 7, the isolation regions 54 are recessed to form Shallow Trench Isolation (STI) regions 54. The isolation regions 54 are recessed such that fins 56 in the first region 50B and in the second region 50C protrude from between neighboring isolation regions 54. Further, the top surfaces of the isolation regions 54 may have a flat surface as illustrated, a convex surface, a concave surface (such as dishing), or a combination thereof. The top surfaces of the isolation regions 54 may be formed flat, convex, and/or concave by an appropriate etch. The isolation regions 54 may be recessed using an acceptable etching process, such as one that is selective to the material of the isolation regions 54. In some embodiments, the entire doped region 55 is etched away during the recess process. In some embodiments a portion of the doped region 55 remains after the recess process, shown as an example in FIGS. 7-16B as doped region 55'. In some embodiments, exposed portions of the doping buffer layer 57 are removed during or after the isolation regions 54 are recessed, as shown in FIG. 7. For example, the recess process may also remove the doping buffer layer 57, or the doping buffer layer 57 may be removed using an additional etch process step.

In some embodiments, a dry plasma etch may be used to recess the isolation regions 54. For example, in some embodiments a plasma etch using fluorocarbon gas, such as $CF_4$, $C_2F_6$, $C_3F_8$, $CHF_3$, or $CH_2F_2$, as an etching gas may be used to etch isolation regions 54 formed from $SiO_2$. In these embodiments, the etch reaction may be described by the following:

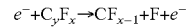

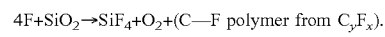

However, for a doped region 55 in which carbon is the dopant, the doped region 55 is $SiO_2$:C, and the etch reaction is described by:

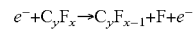

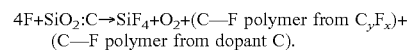

The carbon (C) in the doped region 55 binds to fluorine (F) to form additional C—F polymer, leaving that fluorine (F) unavailable to etch silicon (Si). Thus, the presence of carbon in the doped region 55 reduces the etch rate relative to other portions of isolation regions 54 that are undoped or less-doped. In some cases, the carbon doping may reduce the etch rate more than 10% relative to that of undoped $SiO_2$.

A person having ordinary skill in the art will readily understand that the process described with respect to FIGS. 2 through 7 is just one example of how the fins 56 may be formed. In some embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In some embodiments, heteroepitaxial structures can be used for the fins 52. For example, the fins 52 in FIG. 5 can be recessed, and a material different from the fins 52 may be epitaxially grown in their place.

In an another embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form the fins 56. In some embodiments where homoepitaxial or heteroepitaxial structures are epitaxially grown, the grown materials may be in situ doped during growth, which may obviate prior and subsequent implantations although in situ and implantation doping may be used together.

Still further, it may be advantageous to epitaxially grow a material in an NMOS region different from the material in a PMOS region. In various embodiments, the fins 56 may be formed from silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In some embodiments, the doping buffer layer 57 may be formed over the top of epitaxially grown fins 52. In some embodiments, an etch stop layer is formed over the top surface of each fin 52. This etch stop layer may be, for example, silicon, silicon oxide, silicon nitride, a combination thereof, or the like, and may be deposited or thermally grown according to acceptable techniques.

Further in FIG. 7, appropriate wells (not shown) may be formed in the fins 56, the fins 52, and/or the substrate 50. In some embodiments, a P well may be formed in the first region 50B, and an N well may be formed in the second region 50C. In some embodiments, a P well or an N well are formed in both the first region 50B and the second region 50C.

In the embodiments with different well types, the different implant steps for the first region 50B and the second region 50C may be achieved using a photoresist or other masks (not shown). For example, a photoresist may be formed over the fins 56 and the isolation regions 54 in the first region 50B. The photoresist is patterned to expose the second region 50C of the substrate 50, such as a PMOS region. The photoresist can be formed by using a spin-on technique and can be patterned using acceptable photolithography techniques. Once the photoresist is patterned, an n-type impurity implant is performed in the second region 50C, and the photoresist may act as a mask to substantially prevent n-type impurities from being implanted into the first region 50B, such as an NMOS region. The n-type impurities may be phosphorus, arsenic, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the second region 50C, a photoresist is formed over the fins 56 and the isolation regions 54 in the second region 50C. The photoresist is patterned to expose the first region 50B of the substrate 50, such as the NMOS region. The photoresist can be formed by using a spin-on technique and can be patterned using acceptable photolithography techniques. Once the photoresist is patterned, a p-type impurity implant may be performed in the first region 50B, and the photoresist may act as a mask to substantially prevent p-type impurities from being implanted into the second region 50C, such as the PMOS region. The p-type impurities may be boron, BF2, or the like implanted in the first region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the first region 50B and the second region 50C, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 8:
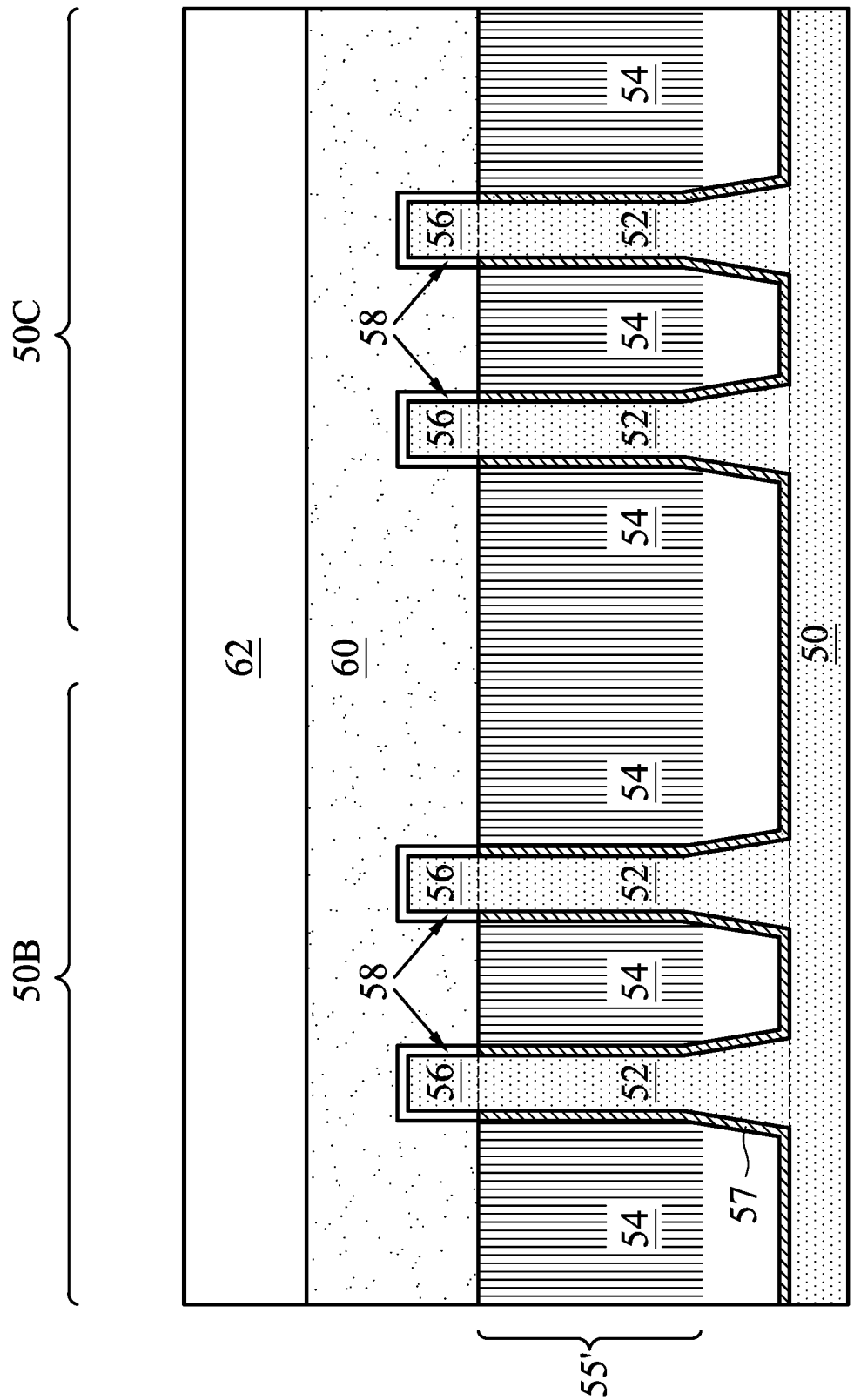

In FIG. 8, a dummy dielectric layer 58 is formed on the fins 56. The dummy dielectric layer 58 may be, for example, silicon oxide, silicon nitride, a combination thereof, or the like, and may be deposited or thermally grown according to acceptable techniques. A dummy gate layer 60 is formed over the dummy dielectric layer 58, and a mask layer 62 is formed over the dummy gate layer 60. The dummy gate layer 60 may be deposited over the dummy dielectric layer 58 and then planarized, such as by a CMP. The mask layer 62 may be deposited over the dummy gate layer 60. The dummy gate layer 60 may be a conductive material, such as polycrystalline-silicon (polysilicon), poly-crystalline silicon-germanium (poly-SiGe), metallic nitrides, metallic silicides, metallic oxides, metals, or the like. In one embodiment, amorphous silicon is deposited and recrystallized to create polysilicon. The dummy gate layer 60 may be deposited by physical vapor deposition (PVD), CVD, sputter deposition, or other techniques known and used in the art for depositing conductive materials. The dummy gate layer 60 may be made of other materials that have a high etching selectivity from the etching of isolation regions. The mask layer 62 may include, for example, SiN, SiON, or the like. In this example, a single dummy gate layer 60 and a single mask layer 62 are formed across the first region 50B and the second region 50C. In some embodiments, separate dummy gate layers may be formed in the first region 50B and the second region 50C, and separate mask layers may be formed in the first region 50B and the second region 50C.

Figure 9A:
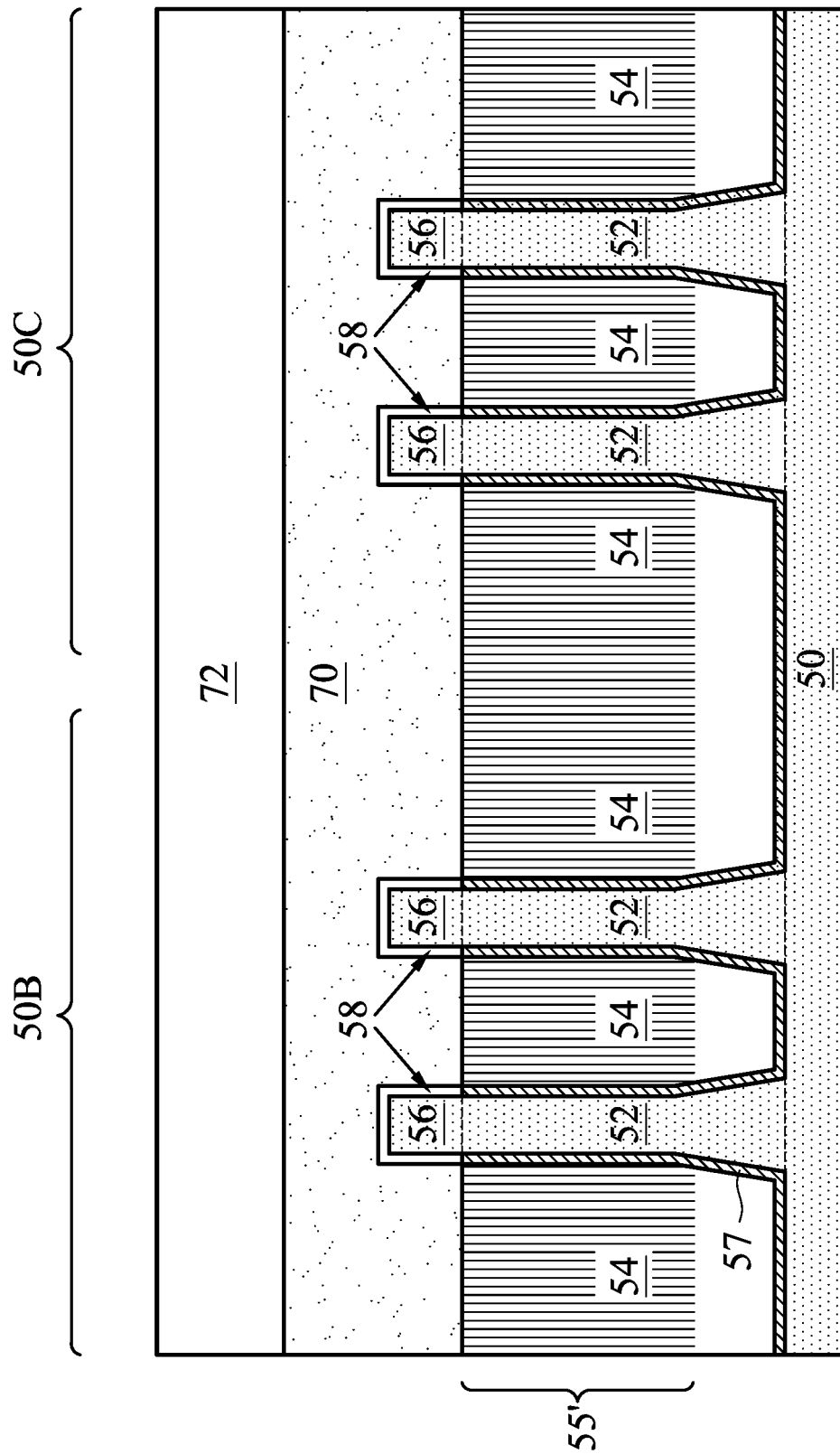
Figure 9B:
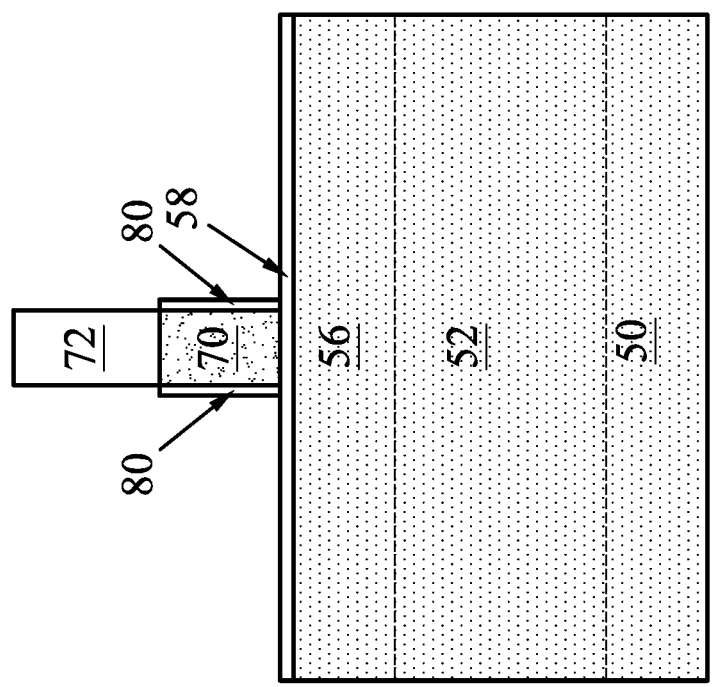

In FIGS. 9A and 9B, the mask layer 62 may be patterned using acceptable photolithography and etching techniques to form masks 72. The pattern of the masks 72 then may be transferred to the dummy gate layer 60 and dummy dielectric layer 58 by an acceptable etching technique to form dummy gates 70. The dummy gates 70 cover respective channel regions of the fins 56. The dummy gates 70 may also have a lengthwise direction substantially perpendicular to the lengthwise direction of respective epitaxial fins.

Further in FIGS. 9A and 9B, gate seal spacers 80 can be formed on exposed surfaces of dummy gates 70 and/or fins 56. A thermal oxidation or a deposition followed by an anisotropic etch may form the gate seal spacers 80.

After the formation of the gate seal spacers 80, implants for lightly doped source/drain (LDD) regions may be performed. In the embodiments with different device types, similar to the implants discussed above in FIGS. 2-7, a mask, such as a photoresist, may be formed over the first region 50B, while exposing the second region 50C, and appropriate type (e.g., n-type or p-type) impurities may be implanted into the exposed fins 56 in the second region 50C. The mask may then be removed. Subsequently, a mask, such as a photoresist, may be formed over the second region 50C while exposing the first region 50B, and appropriate type impurities may be implanted into the exposed fins 56 in the first region 50B. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 10A:
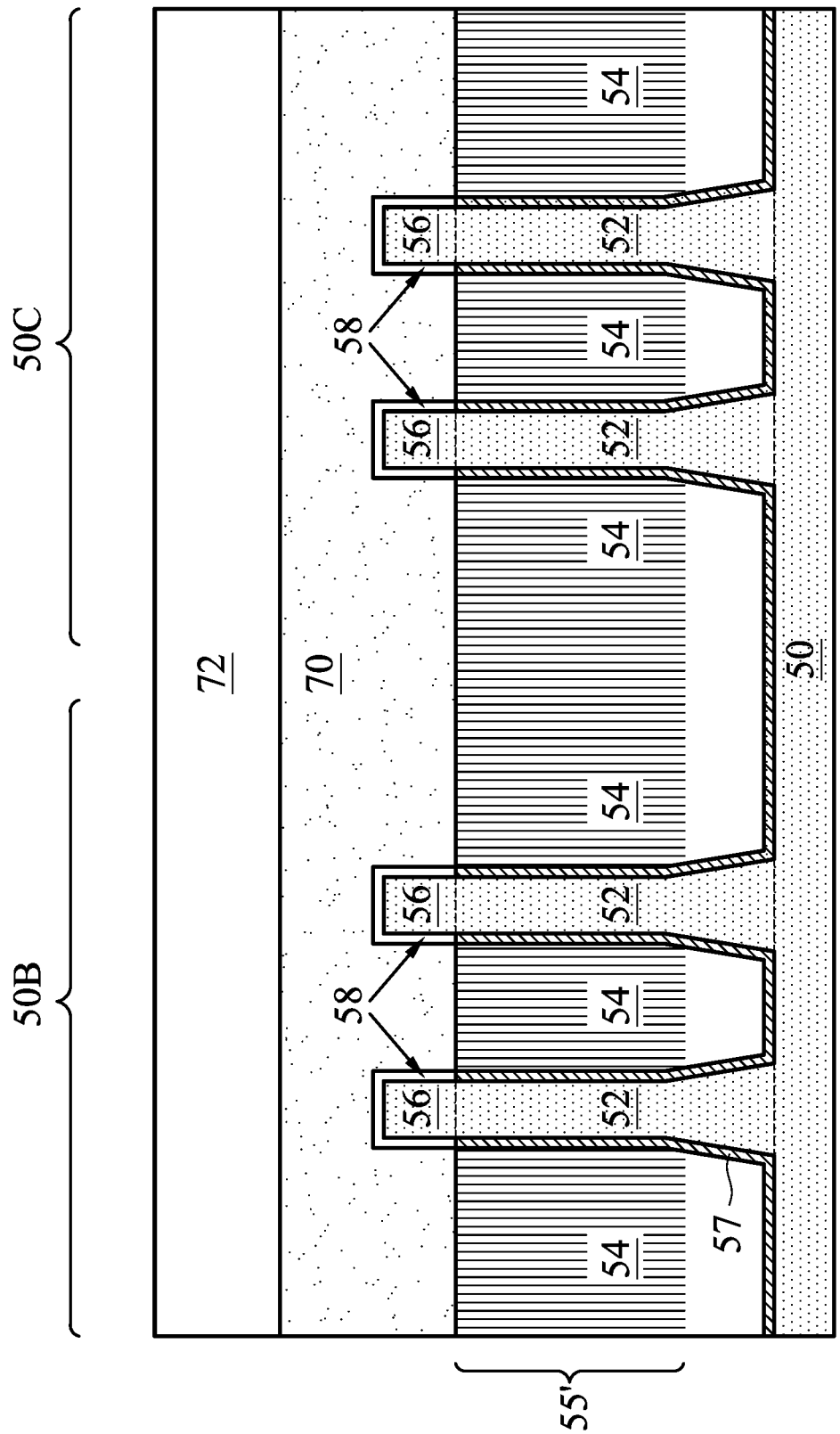
Figure 10B:
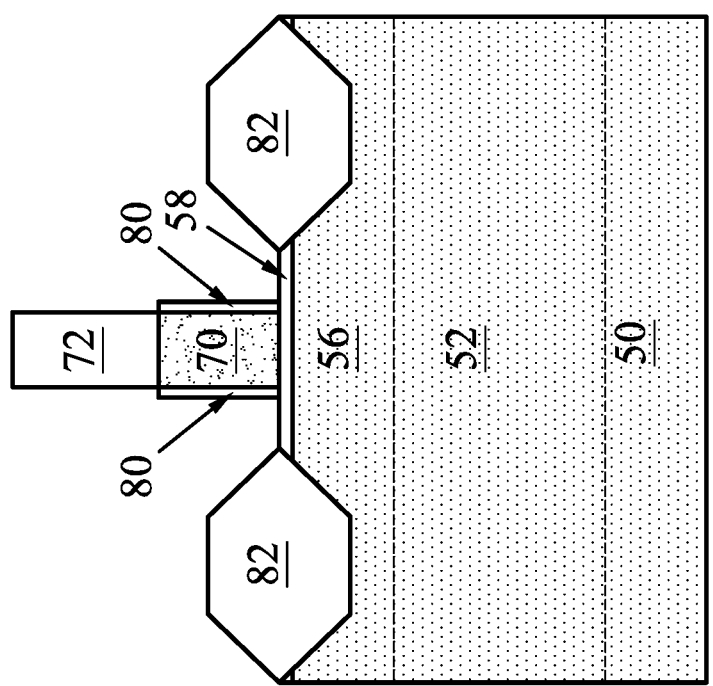

In FIGS. 10A and 10B, epitaxial source/drain regions 82 are formed in the fins 56. The epitaxial source/drain regions 82 are formed in the fins 56 such that each dummy gate 70 is disposed between respective neighboring pairs of the epitaxial source/drain regions 82. In some embodiments that epitaxial source/drain regions 82 may extend into the fins 52.

In the embodiments with different device types, the epitaxial source/drain regions 82 in the regions may be formed in separate processes. In these embodiments, the epitaxial source/drain regions 82 in the first region 50B may be formed by masking the second region 50C and conformally depositing a dummy spacer layer in the first region 50B followed by an anisotropic etch to form dummy gate spacers (not shown) along sidewalls of the dummy gates 70 and/or gate seal spacers 80 in the first region 50B. Then, source/drain regions of the epitaxial fins in the first region 50B are etched to form recesses. The epitaxial source/drain regions 82 in the first region 50B are epitaxially grown in the recesses. If the first region 50B is an n-type device region, the epitaxial source/drain regions 82 may include any acceptable material, such as appropriate for n-type FinFETs. For example, if the fin 56 is silicon, the epitaxial source/drain regions 82 may include silicon, SiC, SiCP, SiP, or the like. If the first region 50B is a p-type device region, the epitaxial source/drain regions 82 may include any acceptable material, such as appropriate for p-type FinFETs. For example, if the fin 56 is silicon, the epitaxial source/drain regions 82 may be formed from SiGe, SiGeB, Ge, GeSn, or the like. The epitaxial source/drain regions 82 in the first region 50B may have surfaces raised from respective surfaces of the fins 56 and may have facets. Subsequently, the dummy gate spacers in the first region 50B are removed, for example, by an etch, as is the mask on the second region 50C.

After the formation of the epitaxial source/drain regions 82 in the first region 50B, the epitaxial source/drain regions 82 in the second region 50C may be formed by masking the first region 50B and conformally depositing a dummy spacer layer in the second region 50C, followed by an anisotropic etch to form dummy gate spacers (not shown) along sidewalls of the dummy gates 70 and/or gate seal spacers 80 in the second region 50C. Then, source/drain regions of the epitaxial fins in the second region 50C are etched to form recesses. The epitaxial source/drain regions 82 in the second region 50C are epitaxially grown in the recesses. The epitaxial source/drain regions 82 in the second region 50C may include any acceptable material, such as appropriate for p-type FinFETs or n-type FinFETs, as described above. The epitaxial source/drain regions 82 in the second region 50C may have surfaces raised from respective surfaces of the fins 56 and may have facets. Subsequently, the dummy gate spacers in the second region 50C are removed, for example, by an etch, as is the mask on the first region 50B.

Figure 11A:
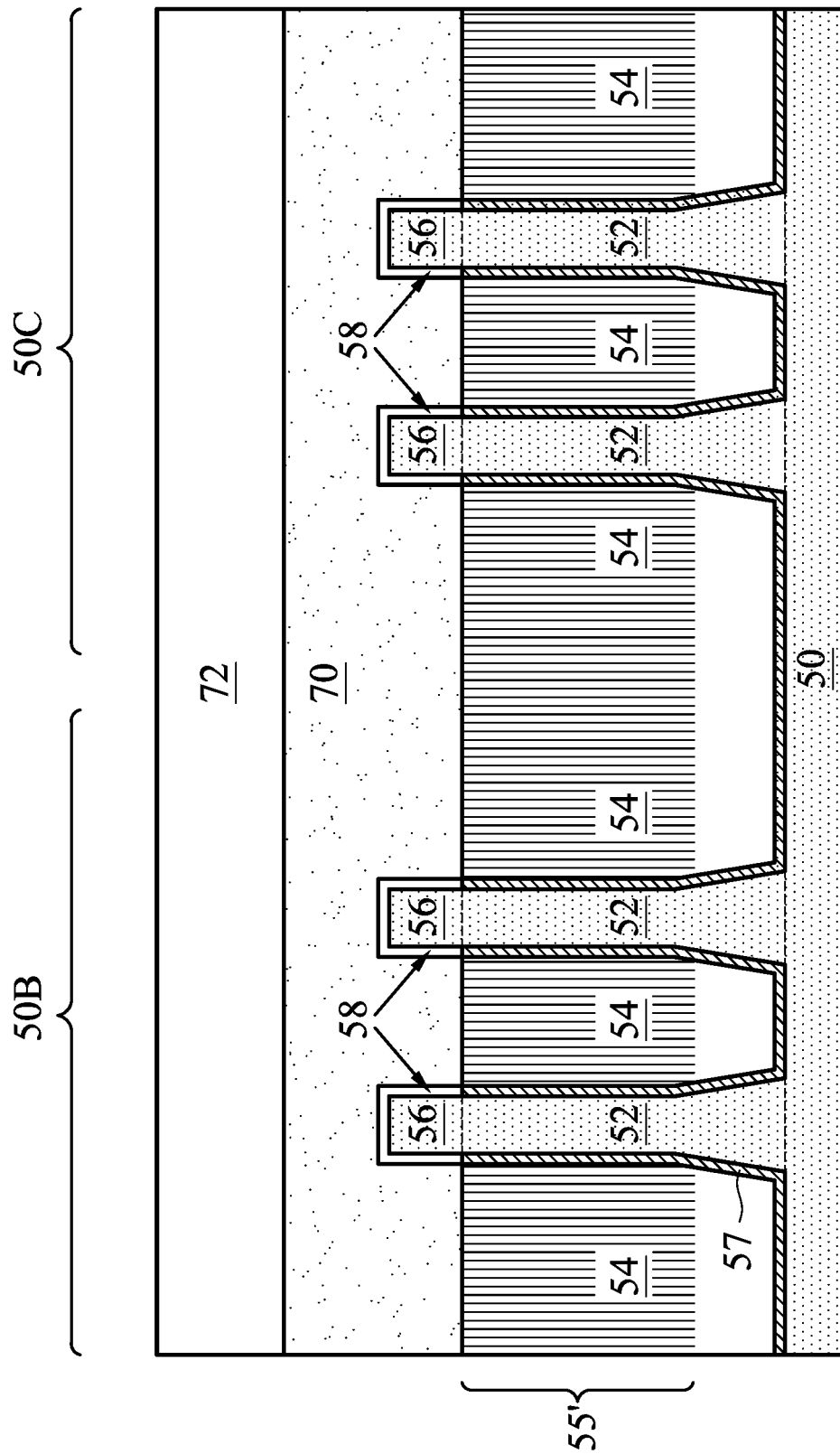
Figure 11B:
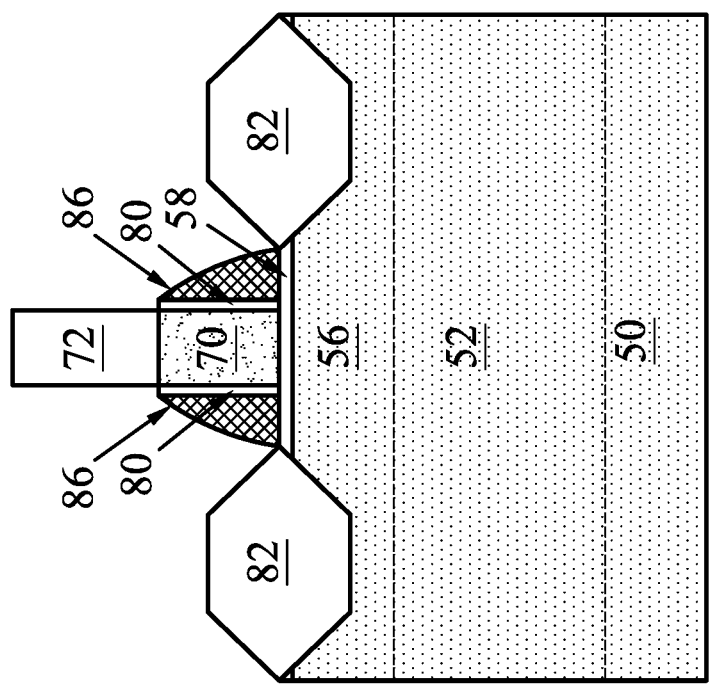

In FIGS. 11A and 11B, gate spacers 86 are formed on the gate seal spacers 80 along sidewalls of the dummy gates 70. The gate spacers 86 may be formed by conformally depositing a material and subsequently anisotropically etching the material. The material of the gate spacers 86 may be silicon nitride, SiCN, a combination thereof, or the like.

The epitaxial source/drain regions 82 and/or epitaxial fins may be implanted with dopants to form source/drain regions, similar to the process previously discussed for forming lightly doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 12A:
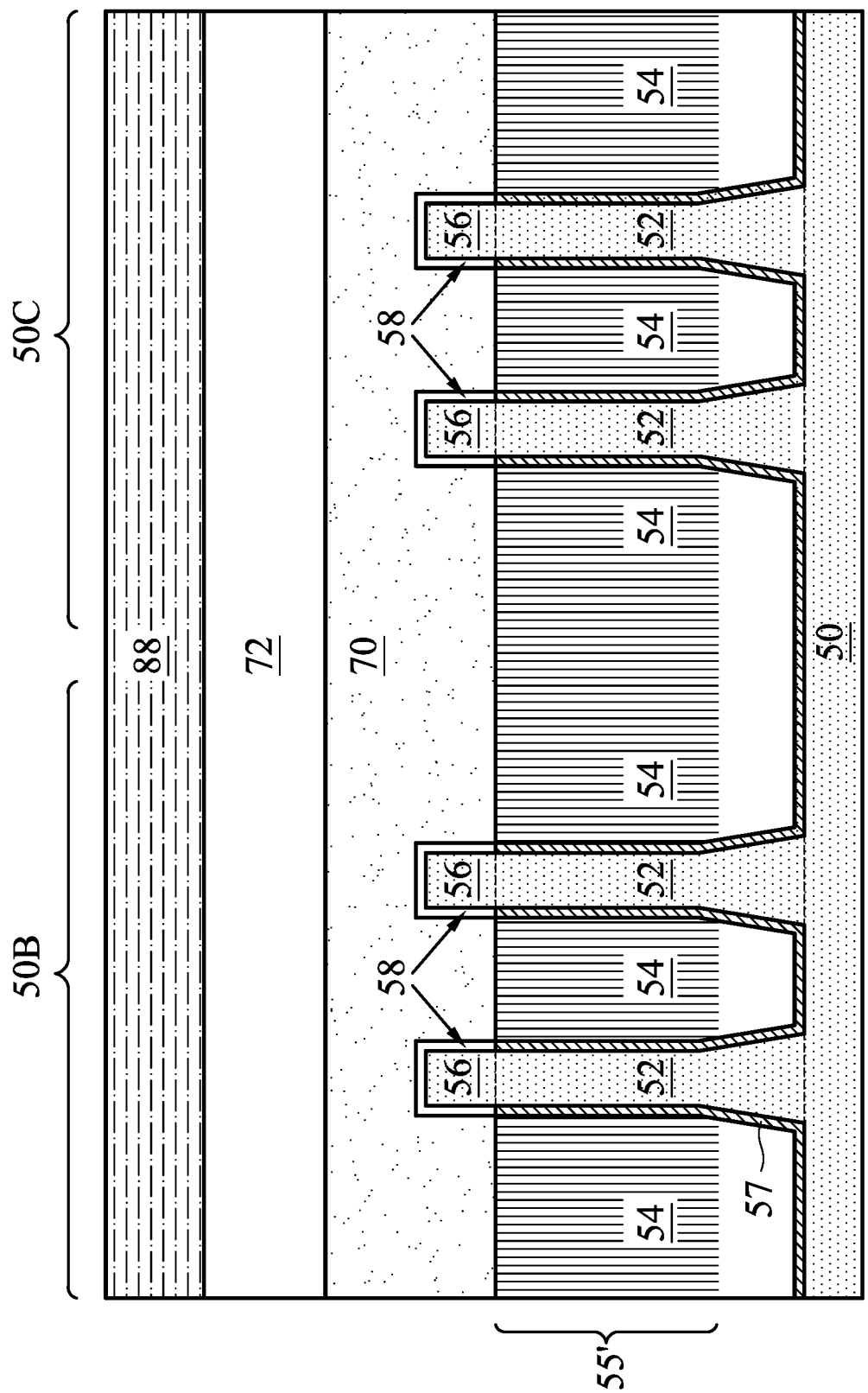
Figure 12B:
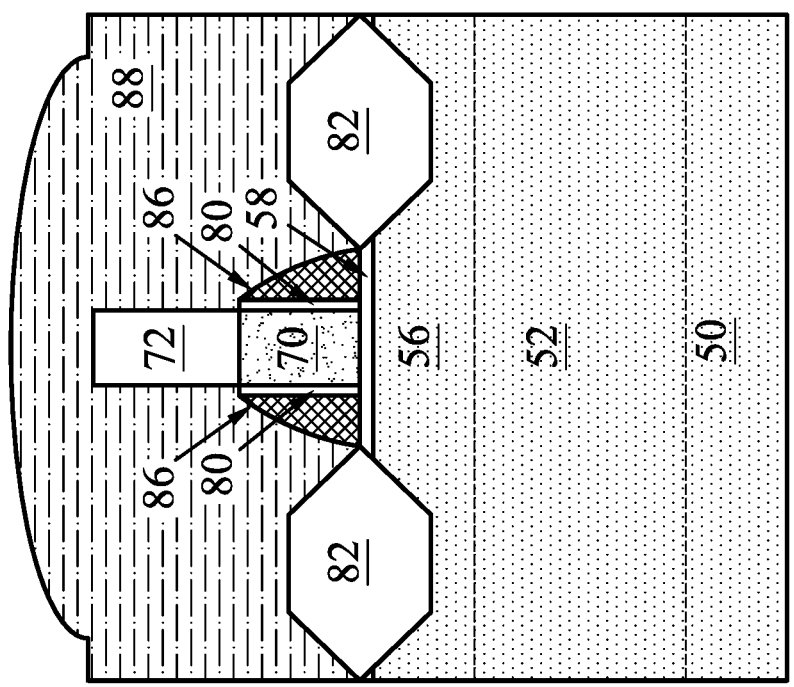

In FIGS. 12A and 12B, an ILD 88 is deposited over the structure illustrated in FIGS. 11A and 11B. The ILD 88 is formed of a dielectric material such as Phospho-Silicate Glass (PSG), Boro-Silicate Glass (BSG), Boron-Doped Phospho-Silicate Glass (BPSG), undoped Silicate Glass (USG), or the like, and may be deposited by any suitable method, such as CVD, plasma-enhanced CVD (PECVD), or FCVD. Other insulation materials formed by any acceptable process may be used.

Figure 13A:
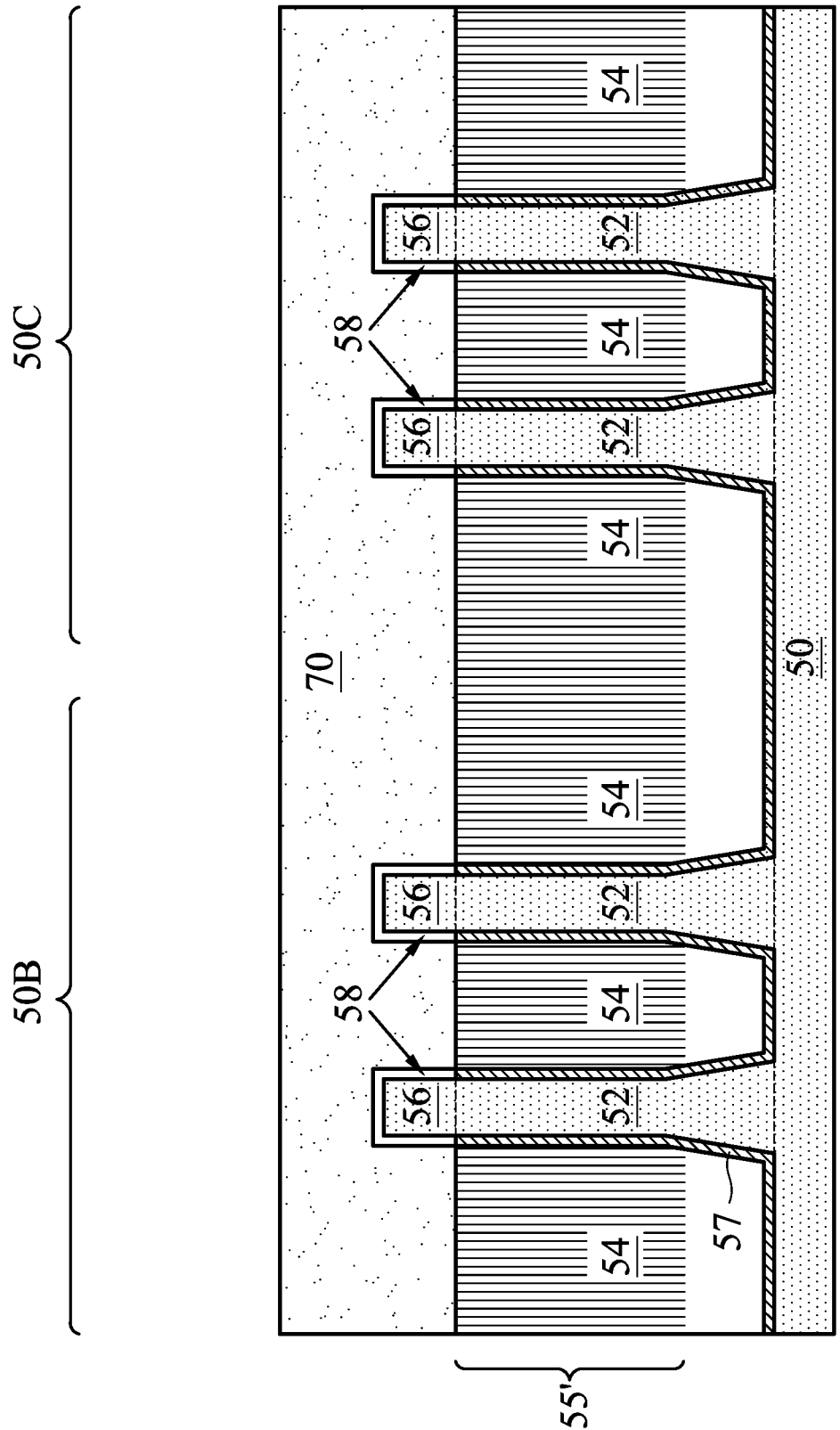
Figure 13B:
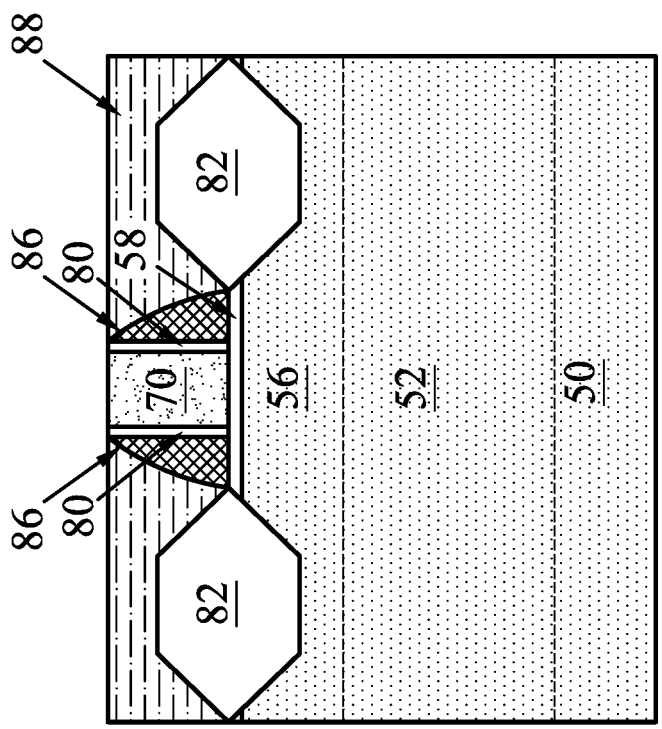

In FIGS. 13A and 13B, a planarization process, such as a CMP, may be performed to level the top surface of ILD 88 with the top surfaces of the dummy gates 70. The CMP may also remove the masks 72 on the dummy gates 70. Accordingly, top surfaces of the dummy gates 70 are exposed through the ILD 88.

Figure 14A:
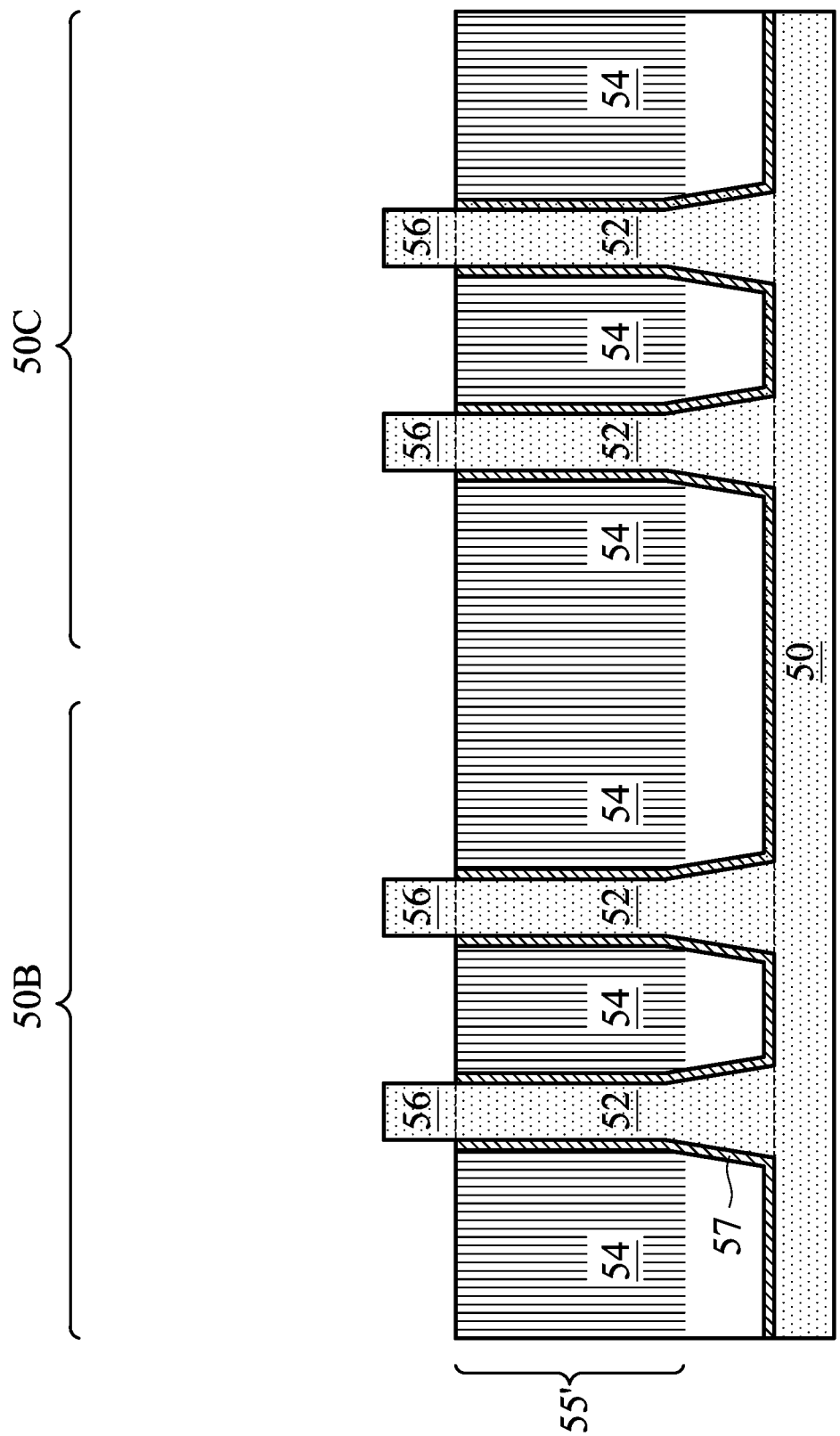
Figure 14B:
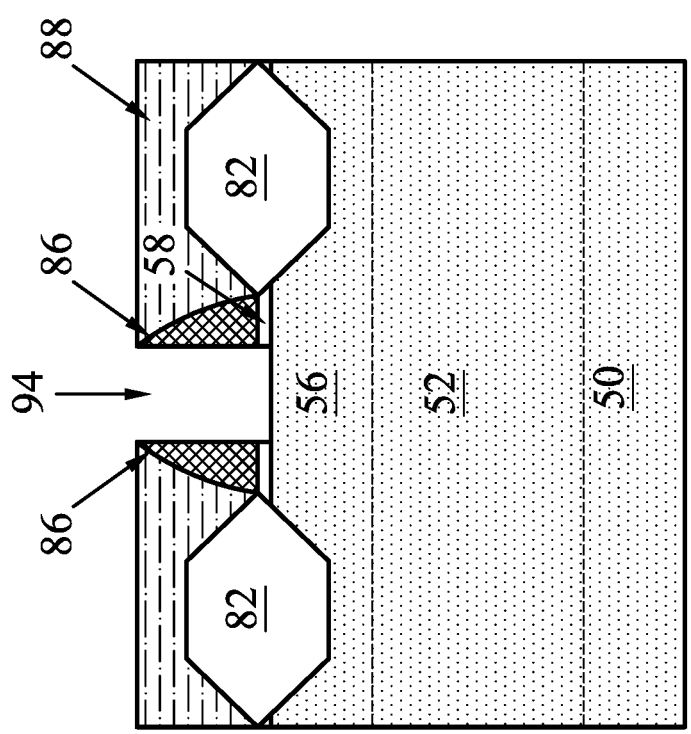

In FIGS. 14A and 14B, the exposed portions of the dummy gates 70, the gate seal spacers 80, and portions of the dummy dielectric layer 58 directly underlying the exposed dummy gates 70 are removed in an etching step(s), so that recesses 94 are formed. In some embodiments, the dummy gates 70 are removed by an anisotropic dry etch process. For example, the etching process may include a dry etch process using reaction gas(es) that selectively etch the dummy gates 70 without etching the dummy ILD 88 or the gate spacers 86. Each recess 94 exposes a channel region of a respective fin. Each channel region is disposed between neighboring pairs of the epitaxial source/drain regions 82. During the removal, the dummy dielectric layer 58 may be used as an etch stop layer when the dummy gates 70 are etched. The dummy dielectric layer 58 and the gate seal spacers 80 may then be removed after the removal of the dummy gates 70.

Figure 15A:
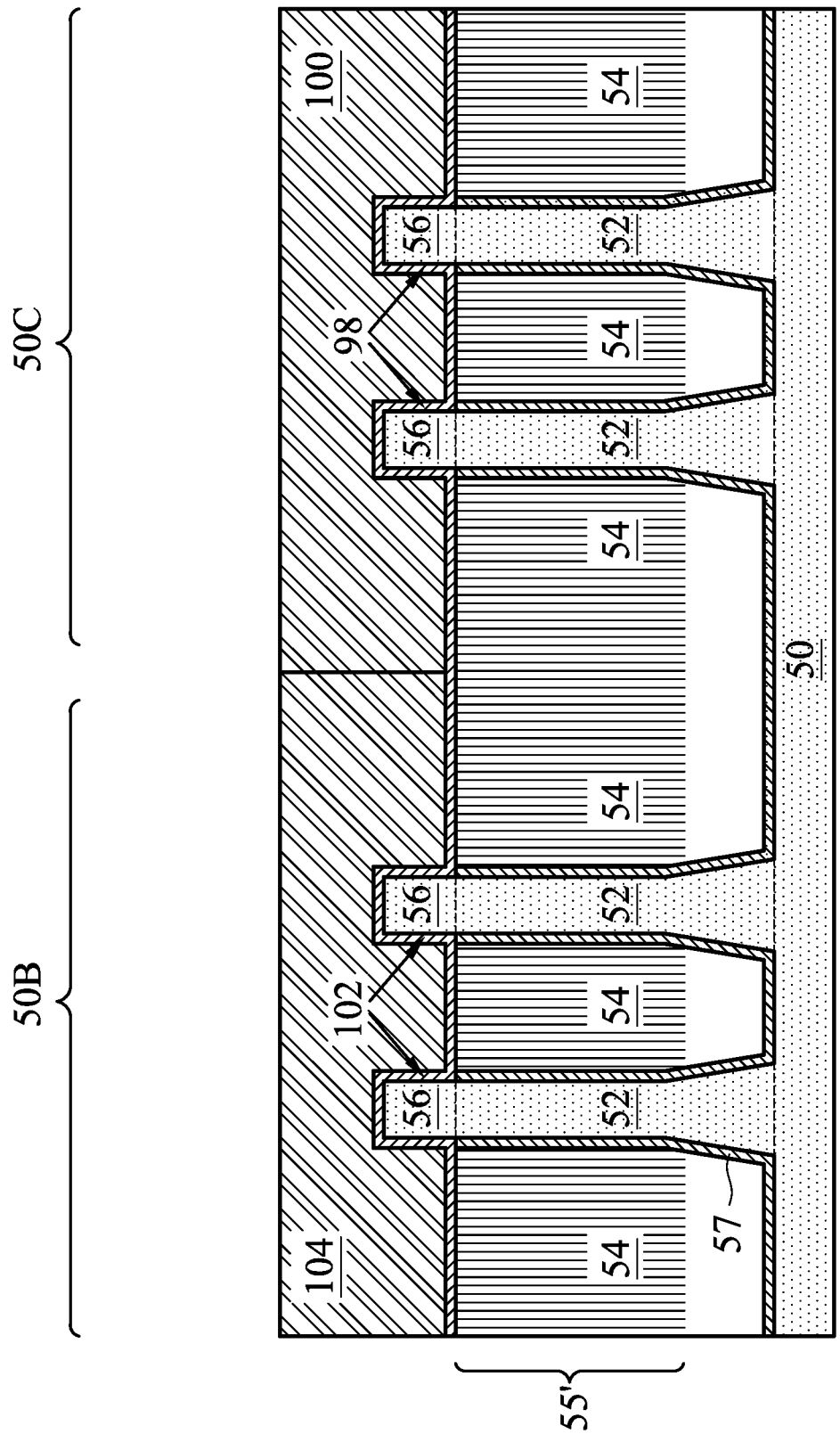
Figure 15B:
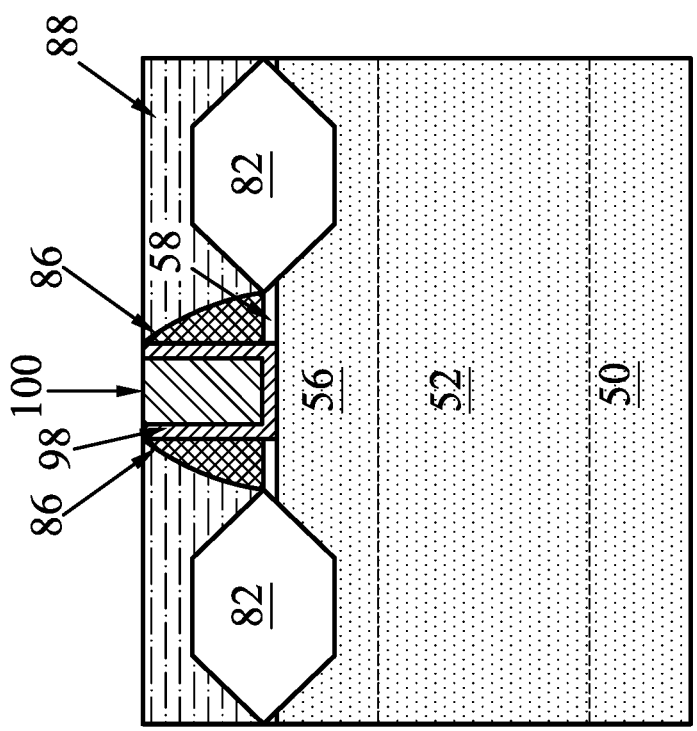

In FIGS. 15A and 15B, gate dielectric layers 98 and 102 and gate electrodes 100 and 104 are formed for replacement gates. Gate dielectric layers 98 and 102 are deposited conformally in the recesses 94, such as on the top surfaces and the sidewalls of the fins 56 and on sidewalls of the gate spacers 86, and on a top surface of the dummy ILD 88. In accordance with some embodiments, the gate dielectric layers 98 and 102 are silicon oxide, silicon nitride, or multilayers thereof. In some embodiments, the gate dielectric layers 98 and 102 are a high-k dielectric material, and in these embodiments, the gate dielectric layers 98 and 102 may have a k value greater than about 7.0, and may include a metal oxide or a silicate of Hf, Al, Zr, La, Mg, Ba, Ti, Pb, and combinations thereof. The formation methods of the gate dielectric layers 98 and 102 may include Molecular-Beam Deposition (MBD), Atomic Layer Deposition (ALD), PECVD, and the like.

The gate electrodes 100 and 104 are deposited over the gate dielectric layers 98 and 102, respectively, and fill the remaining portions of the recesses 94. The gate electrodes 100 and 104 may be a metal-containing material such as TiN, TaN, TaC, Co, Ru, Al, combinations thereof, or multi-layers thereof. After the filling of the gate electrodes 100 and 104, a planarization process, such as a CMP, may be performed to remove the excess portions of the gate dielectric layers 98 and 102 and the material of the gate electrodes 100 and 104, which excess portions are over the top surface of the ILD 88. The resulting remaining portions of material of the gate electrodes 100 and 104 and the gate dielectric layers 98 and 102 thus form replacement gates of the resulting FinFETs.

The formation of the gate dielectric layers 98 and 102 may occur simultaneously such that the gate dielectric layers 98 and 102 are formed from the same materials, and the formation of the gate electrodes 100 and 104 may occur simultaneously such that the gate electrodes 100 and 104 are formed from the same materials. In some embodiments, the gate dielectric layers 98 and 102 may be formed by distinct processes, such that the gate dielectric layers 98 and 102 may be different materials, and the gate electrodes 100 and 104 may be formed by distinct processes, such that the gate electrodes 100 and 104 may be different materials. Various masking steps may be used to mask and expose appropriate regions when using distinct processes.

Figure 16A:
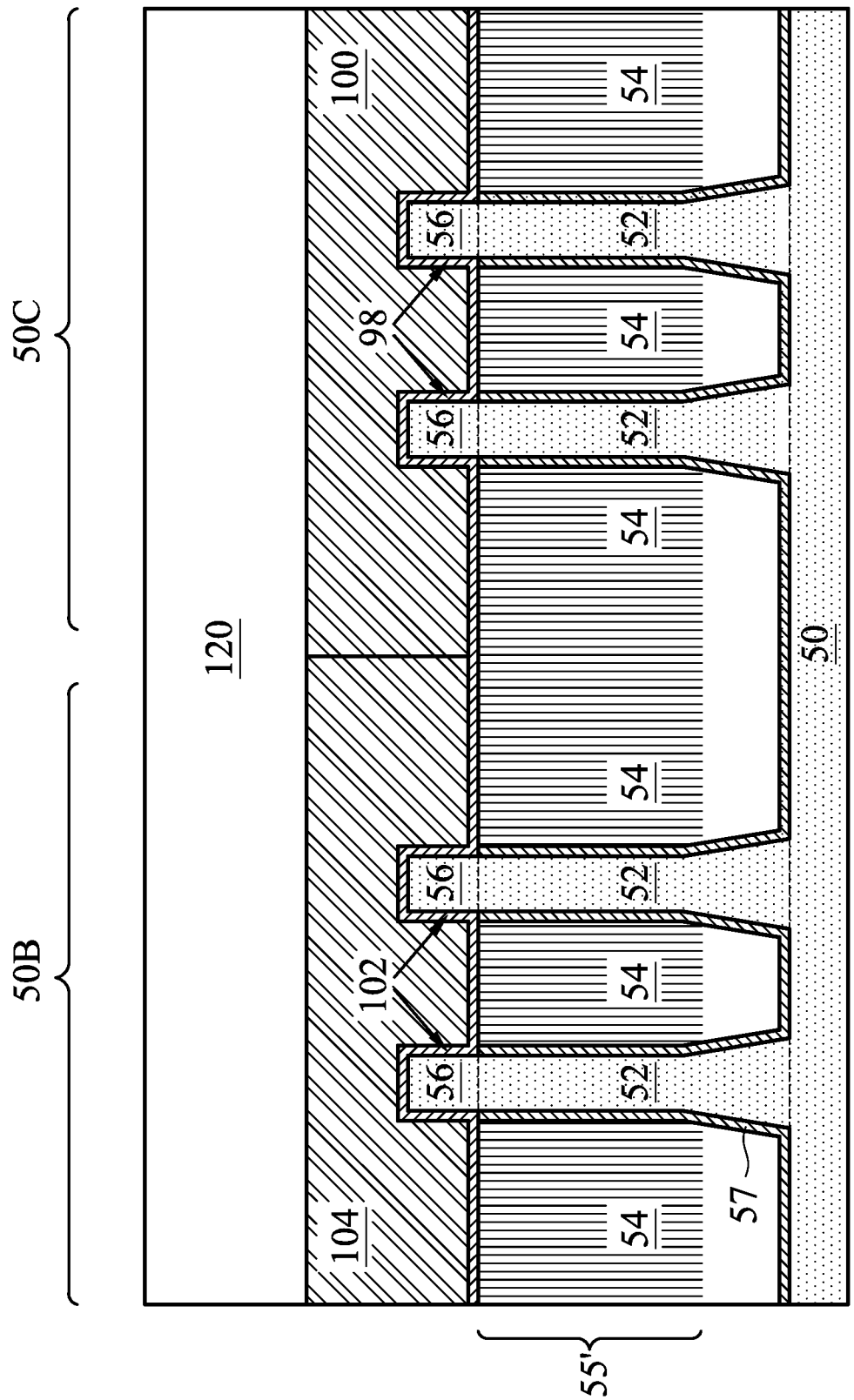
Figure 16B:
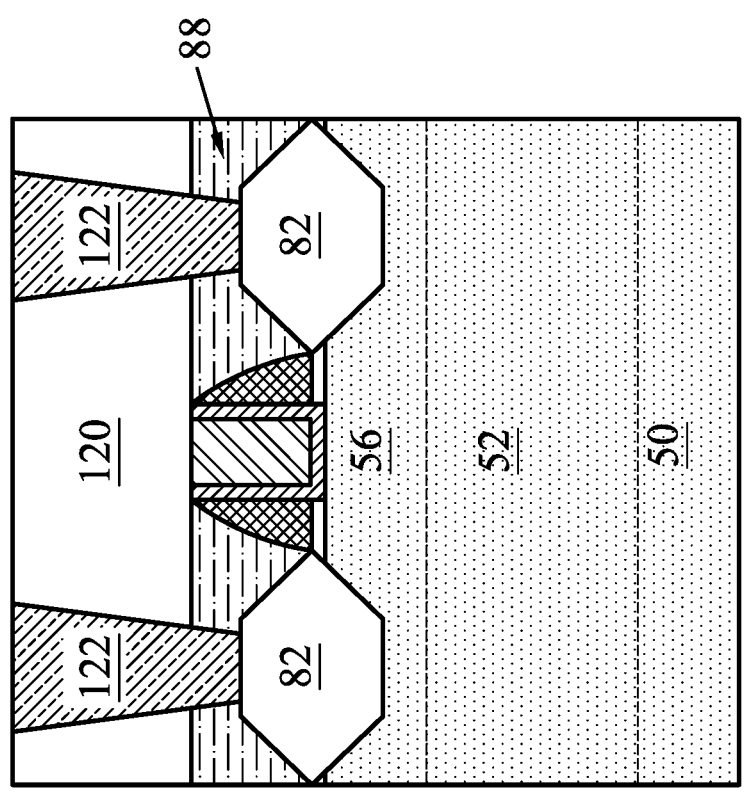

In FIGS. 16A and 16B, an ILD 120 is deposited over ILD 88, and contacts 122 are formed through ILD 120 and ILD 88. The ILD 120 is formed over the ILD 88, the replacement gates, the gate spacers 86. The ILD 120 is formed of a dielectric material such as PSG, BSG, BPSG, USG, or the like, and may be deposited by any suitable method, such as CVD and PECVD. Openings for contacts 122 are formed through the ILD 88 and the ILD 120. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, aluminum, nickel, or the like. A planarization process, such as a CMP, may be performed to remove excess material from a surface of the ILD 120. The remaining liner and conductive material form contacts 122 in the openings. An anneal process may be performed to form a silicide at the interface between the epitaxial source/drain regions 82 and the contacts 122, respectively. Contacts 122 are physically and electrically coupled to the epitaxial source/drain regions 82.

Although not explicitly shown, a person having ordinary skill in the art will readily understand that further processing steps may be performed on the structure in FIGS. 16A and 16B. For example, various Inter-Metal Dielectrics (IMD) and their corresponding metallizations may be formed over ILD 120.

Embodiments of the present disclosure may achieve advantages, such as providing more precise etch control during the fin recess etch and STI formation. Embodiments may also provide increased precision and uniformity of fin height. Embodiments may also reduce the likelihood of voids forming in the STI during fin recess etch and STI formation.

According to an embodiment, a method includes forming a fin on a substrate, forming an isolation region on opposing sides of the fin, doping the isolation region with carbon to form a doped region, and removing a portion of the isolation region to expose a top portion of the fin, wherein the removed portion of the isolation region includes at least a portion of the doped region.

According to an embodiment, a method includes forming a dielectric material over a plurality of semiconductor fins, adding an impurity into the dielectric material, and recessing a portion of the dielectric material to expose top portions of the plurality of semiconductor fins.

According to an embodiment, a semiconductor device includes a fin extending from a substrate and an isolation region over the substrate and over opposite sidewalls of the fin, wherein a top surface of the fin extends above a top surface of the isolation region, and wherein a portion of the isolation region extending from the top surface of the isolation region includes a dopant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin on a substrate, wherein a top surface of the fin is a first height above the substrate;
   forming an isolation region on opposing sidewalls of the fin, wherein the isolation region comprises a dielectric material, wherein a top surface of the isolation region is at least the first height above the substrate;
   doping a first portion of the isolation region with carbon to form an upper doped region and a lower doped region, wherein the upper doped region has a concentration of the carbon greater than a concentration of the carbon of the lower doped region, and wherein the upper doped region is farther from the substrate than the lower doped region, and wherein an undoped region of the isolation region is interposed between the substrate and the lower doped region; and
   after doping the upper doped region of the isolation region with carbon, removing a second portion of the isolation region to expose a top portion of the fin, wherein the removed second portion of the isolation region comprises at least a portion of the upper doped region.

2. The method of claim 1, further comprising forming a protective layer over the fin and the substrate before forming the isolation region, wherein the protective layer covers the opposing sidewalls of the fin.

3. The method of claim 1, wherein forming the isolation region comprises flowing a flowable dielectric material over the substrate.

4. The method of claim 1, further comprising annealing the isolation region.

5. The method of claim 1, wherein doping the first portion of the isolation region comprises implanting the carbon within the isolation region.

6. The method of claim 1, wherein doping the first portion of the isolation region with carbon comprises forming a layer over the isolation region, the layer comprising the carbon, and annealing the layer.

7. The method of claim 1, wherein removing the second portion of the isolation region comprises an etch process, and wherein a first region of the first portion of the isolation region having a higher concentration of the carbon has an etch rate that is lower than an etch rate of a second region of the first portion of the isolation region having a lower concentration of the carbon.

8. The method of claim 7, wherein the etch process comprises a plasma etch process.

9. A method comprising:
   depositing a dielectric material over a plurality of semiconductor fins, the plurality of semiconductor fins protruding from a substrate, wherein the dielectric material extends along sidewalls of the plurality of semiconductor fins and covers top portions of the plurality of semiconductor fins;
   after depositing the dielectric material, adding an impurity into the dielectric material, wherein the impurity extends into the dielectric material from a top surface of the dielectric material to a first depth, wherein the first depth is less than a thickness of the dielectric material, wherein first portions of the dielectric material proximal the top portions of the plurality of semiconductor fins have a first amount of impurity, and wherein second portions of the dielectric material proximal the substrate have a second amount of impurity that is less than the first amount of impurity; and recessing the first portions of the dielectric material to expose the top portions of the plurality of semiconductor fins.

10. The method of claim 9, wherein the impurity is carbon.

11. The method of claim 9, wherein a first region of the dielectric material containing the impurity has a first refractive index and a second region of the dielectric material that is free of the impurity has a second refractive index, wherein the first refractive index is lower than the second refractive index.

12. The method of claim 11, wherein the first refractive index is in the range from 1.41 to 1.42 and the second refractive index is in the range from 1.43 to 1.46.

13. The method of claim 9, further comprising forming a buffer layer over the plurality of semiconductor fins and wherein the dielectric material is formed over the buffer layer.

14. The method of claim 13, wherein the buffer layer comprises silicon nitride.

15. The method of claim 9, wherein adding the impurity into the dielectric material comprises an implantation process.

16. The method of claim 9, wherein adjacent semiconductor fins in a first set of the plurality of semiconductor fins are spaced apart a different distance than adjacent semiconductor fins in a second set of the plurality of semiconductor fins.

* * * * *